United States Patent
Shima

(10) Patent No.: US 12,010,837 B2
(45) Date of Patent: Jun. 11, 2024

(54) SEMICONDUCTOR MEMORY DEVICE AND MANUFACTURING METHOD THEREOF

(71) Applicant: Kioxia Corporation, Tokyo (JP)

(72) Inventor: Yusuke Shima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/886,164

(22) Filed: Aug. 11, 2022

(65) Prior Publication Data

US 2022/0384471 A1  Dec. 1, 2022

Related U.S. Application Data

(63) Continuation of application No. 16/807,625, filed on Mar. 3, 2020, now Pat. No. 11,456,309.

(30) Foreign Application Priority Data

Aug. 28, 2019  (JP) .................................. 2019-155604

(51) Int. Cl.
| | |
|---|---|
| *H10B 41/27* | (2023.01) |
| *G11C 5/02* | (2006.01) |
| *G11C 5/06* | (2006.01) |
| *H01L 21/3065* | (2006.01) |
| *H01L 21/3105* | (2006.01) |
| *H01L 21/67* | (2006.01) |
| *H01L 21/768* | (2006.01) |

(Continued)

(52) U.S. Cl.
CPC ............. *H10B 41/27* (2023.02); *G11C 5/025* (2013.01); *G11C 5/06* (2013.01); *H01L 21/3065* (2013.01); *H01L 21/31053* (2013.01); *H01L 21/67075* (2013.01); *H01L 21/76876* (2013.01); *H01L 29/04* (2013.01); *H10B 43/27* (2023.02)

(58) Field of Classification Search
CPC ........ H10B 41/27; H10B 43/27; H10B 43/10; H10B 43/00; H10B 43/35; G11C 5/025; G11C 5/06; H01L 21/3065; H01L 21/31053; H01L 21/67075; H01L 21/76876; H01L 29/04
See application file for complete search history.

(56) References Cited

U.S. PATENT DOCUMENTS

| | | |
|---|---|---|
| 9,985,044 B2 | 5/2018 | Tokuhira et al. |
| 2016/0268304 A1 | 9/2016 | Ikeda et al. |

(Continued)

FOREIGN PATENT DOCUMENTS

JP     2016-171243     9/2016

*Primary Examiner* — Galina G Yushina
(74) *Attorney, Agent, or Firm* — Oblon, McClelland, Maier & Neustadt, L.L.P.

(57) ABSTRACT

A semiconductor memory device includes a first region where a plurality of conductive layers, a plurality of insulating layers, a semiconductor layer, and a gate insulating layer are formed and a second region different from the first region above a substrate. The plurality of conductive layers include a plurality of first conductive layers and a plurality of second conductive layers. The semiconductor memory device includes a plurality of first films different from the first conductive layers disposed in same layers as the plurality of first conductive layers in the second region and a plurality of second films different from the second conductive layers and the first films disposed in same layers as the plurality of second conductive layers in the second region.

20 Claims, 28 Drawing Sheets

(51) Int. Cl.
 *H01L 29/04* (2006.01)
 *H10B 43/27* (2023.01)

(56) References Cited

U.S. PATENT DOCUMENTS

| | | |
|---|---|---|
| 2017/0236746 A1 | 8/2017 | Yu et al. |
| 2017/0263614 A1 | 9/2017 | Tokuhira et al. |
| 2017/0338241 A1* | 11/2017 | Lee .................... H01L 27/0688 |
| 2018/0083029 A1 | 3/2018 | Tanaka et al. |
| 2020/0083239 A1* | 3/2020 | Komiya ................. H10B 43/27 |
| 2020/0279864 A1* | 9/2020 | Komiya ................. H10B 41/35 |
| 2020/0312861 A1 | 10/2020 | Kim |
| 2020/0381447 A1* | 12/2020 | Kim ..................... H01L 23/528 |

* cited by examiner

SEMICONDUCTOR MEMORY DEVICE AND MANUFACTURING METHOD THEREOF

CROSS-REFERENCE TO RELATED APPLICATIONS

This application is a continuation of and claims benefit under 35 U.S.C. § 120 to U.S. application Ser. No. 16/807,625, filed on Mar. 3, 2020, which is based upon and claims the benefit of priority under 35 U.S.C. § 119 to Japanese Patent Application No. 2019-155604, filed on Aug. 28, 2019, the entire contents of each of which are incorporated herein by reference.

BACKGROUND

Field

Embodiments described herein relate generally to a semiconductor memory device and a manufacturing method thereof.

Description of the Related Art

There has been known a semiconductor memory device that includes a substrate, a plurality of conductive layers disposed in a first direction intersecting with a surface of the substrate and extending in a second direction intersecting with the first direction, a plurality of insulating layers each disposed between the plurality of conductive layers, a semiconductor layer extending in the first direction and opposed to the plurality of conductive layers and the plurality of insulating layers, and a gate insulating layer disposed between the plurality of conductive layers and the semiconductor layer.

DETAILED DESCRIPTION

Figure 1:
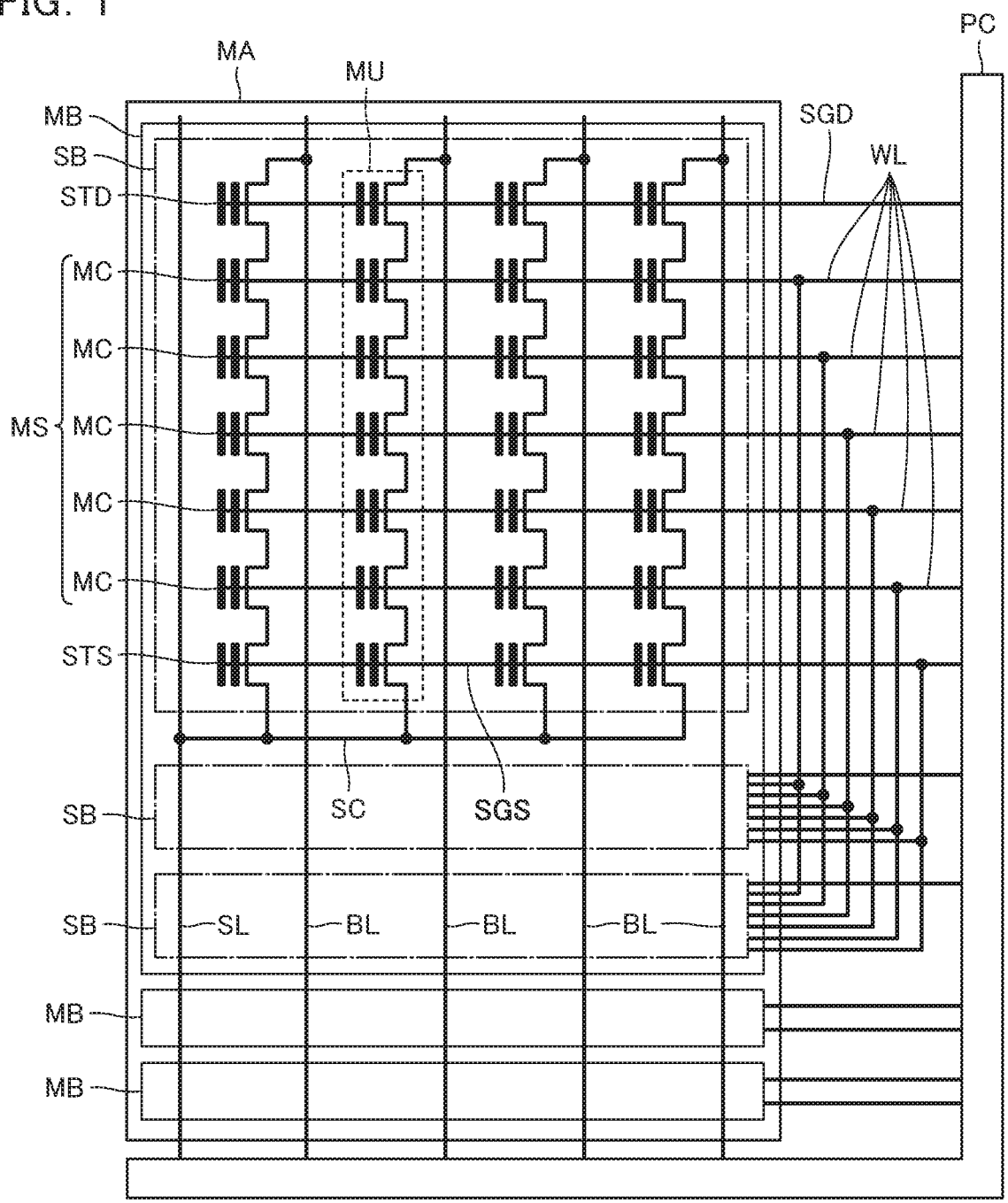
FIG. 1 is an equivalent circuit diagram illustrating a schematic configuration of a semiconductor memory device according to a first embodiment.

A semiconductor memory device according to one embodiment includes a substrate, a plurality of conductive layers, a plurality of insulating layers, a semiconductor layer, and a gate insulating layer. The plurality of conductive layers are disposed in a first direction intersecting with a surface of the substrate and extend in a second direction intersecting with the first direction. The plurality of insulating layers are each disposed between the plurality of conductive layers. The semiconductor layer extends in the first direction and is opposed to the plurality of conductive layers and the plurality of insulating layers. The gate insulating layer is disposed between the plurality of conductive layers and the semiconductor layer. A first region where the plurality of conductive layers, the plurality of insulating layers, the semiconductor layer, and the gate insulating layer are formed and a second region different from the first region are provided above the substrate. The plurality of conductive layers include a plurality of first conductive layers and a plurality of second conductive layers. A plurality of first films different from the first conductive layers are disposed in same layers as the plurality of first conductive layers in the second region and a plurality of second films different from the second conductive layers and the first films are disposed in same layers as the plurality of second conductive layers in the second region.

Next, semiconductor memory devices according to embodiments will be described in detail with reference to the drawings. The following embodiments are merely examples, and will not be described for the purpose of limiting the present invention.

In this specification, a predetermined direction parallel to a surface of a substrate is referred to as an X direction, a direction parallel to the surface of the substrate and perpendicular to the X direction is referred to as a Y direction, and a direction perpendicular to the surface of the substrate is referred to as a Z direction.

In this specification, a direction intersecting with a predetermined surface may be referred to as a first direction, a direction intersecting the first direction along this predetermined surface may be referred to as a second direction, and a direction intersecting with the second direction along this predetermined surface may be referred to as a third direction. These first direction, second direction, and third direction may correspond to any of the Z direction, the X direction, and the Y direction or need not to correspond to these directions.

Expressions such as "above" and "below" in this specification are based on the substrate. For example, when the first direction intersects with the surface of the substrate, a direction away from the substrate along the first direction is referred to as above and a direction approaching the substrate along the first direction is referred to as below. A lower surface and a lower end of a certain configuration mean a surface and an end portion on the substrate side of this configuration. A top surface and an upper end of a certain configuration mean a surface and an end portion on a side opposite to the substrate of this configuration. A surface intersecting with the second direction or the third direction is referred to as a side surface or the like.

In this specification, when referring to that a first configuration is "electrically connected" to a second configuration, the first configuration may be directly connected to the second configuration, or the first configuration may be connected to the second configuration via wiring, a semiconductor member, a transistor, or the like. For example, when three transistors are connected in series, even if the second transistor is in OFF state, the first transistor is "electrically connected" to the third transistor.

In this specification, when referring to that the first configuration is "electrically insulated" from the second configuration, this means, for example, a state where an insulating layer or the like is disposed between the first configuration and the second configuration while a contact, a wiring, or the like to connect the first configuration to the second configuration is not disposed.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

With reference to the drawings, configurations of the semiconductor memory devices according to the embodiments will be described below. The following drawings are schematic, and for convenience of explanation, a part of a configuration is sometimes omitted.

First Embodiment

[Configuration]

FIG. 1 is an equivalent circuit diagram illustrating a schematic configuration of a semiconductor memory device according to the first embodiment. For convenience of description, FIG. 1 omits a part of a configuration.

The semiconductor memory device according to the embodiment includes a memory cell array MA and a peripheral circuit PC controlling the memory cell array MA.

The memory cell array MA includes a plurality of memory blocks MB. The plurality of memory blocks MB each include a plurality of sub-blocks SB. The plurality of sub-blocks SB each include a plurality of memory units MU. The plurality of memory units MU each have one end connected to the peripheral circuit PC via a bit line BL. The plurality of memory units MU each have the other end connected to the peripheral circuit PC via a common lower wiring SC and source line SL.

The memory unit MU includes a drain select transistor STD, a memory string MS, and a source select transistor STS, which are connected in series between the bit line BL and the lower wiring SC. Hereinafter, the drain select transistor STD and the source select transistor STS may be simply referred to as select transistors (STD, STS).

The memory string MS includes a plurality of memory cells MC connected in series. The memory cell MC is a field-effect type transistor including a semiconductor layer, a gate insulating layer, and a gate electrode. The semiconductor layer functions as a channel region. The gate insulating layer includes a memory portion that can store data. This memory portion is, for example, an electric charge accumulation layer such as a silicon nitride film (SiN) and a floating gate. In this case, the memory cell MC has a threshold voltage that varies corresponding to an amount of electric charge in the electric charge accumulation layer. The gate electrode is connected to a word line WL. The word lines WL are disposed corresponding to the plurality of memory cells MC belonging to one memory string MS and are connected to all the memory strings MS in one memory block MB in common.

The select transistor (STD, STS) is a field-effect type transistor including a semiconductor layer, a gate insulating layer, and a gate electrode. The semiconductor layer functions as a channel region. The gate electrode of the drain select transistor STD is connected to a drain select line SGD. The drain select line SGD is disposed corresponding to the sub-block SB and connected to all the drain select transistors STD in one sub-block SB in common. The gate electrode of the source select transistor STS is connected to a source select line SGS. The source select line SGS is connected to all the source select transistors STS in one memory block MB in common.

The peripheral circuit PC generates voltages used for, for example, a read operation, a write operation, and an erase operation and applies the voltages to the bit line BL, the source line SL, the word line WL, and the select gate line (SGD, SGS). The peripheral circuit PC, for example, includes a plurality of transistors and wirings disposed on the same chip as the memory cell array MA.

Figure 2:
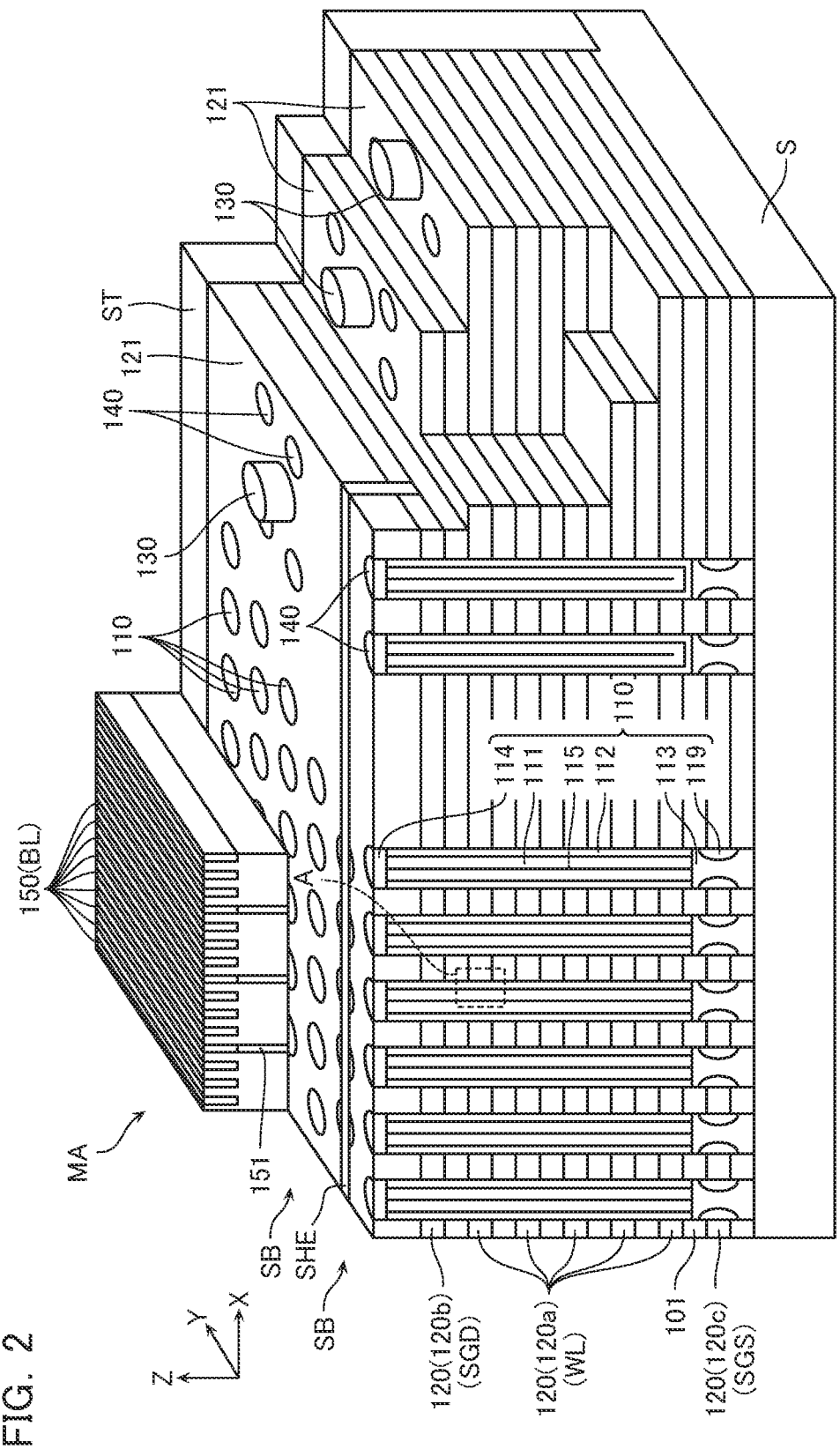
FIG. 2 is a schematic perspective view of the semiconductor memory device.

FIG. 2 is a schematic perspective view of the semiconductor memory device according to the embodiment. For convenience of explanation, FIG. 2 omits a part of a configuration.

As illustrated in FIG. 2, the semiconductor memory device according to the embodiment includes a substrate S and the memory cell array MA disposed above the substrate S.

The substrate S is, for example, a semiconductor substrate made of a single-crystal silicon (Si) or the like. The substrate S has, for example, an N type impurity layer of phosphorus (P) or the like on a surface of the semiconductor substrate, and further includes a double well structure having a P type impurity layer of boron (B) or the like within this N type impurity layer. In the embodiment, a surface of the substrate S is a wiring layer functioning as the lower wiring SC. Note that a wiring layer may be additionally disposed above the substrate S.

The memory cell array MA includes a plurality of memory structures 110 extending in the Z direction, a plurality of conductive layers 120 that cover outer peripheral surfaces of the plurality of memory structures 110 on the X-Y cross-sectional surface, contacts 130 connected to the plurality of conductive layers 120, first structures 140 disposed near the contact 130, and a plurality of wirings 150 connected to upper ends of the memory structures 110.

The memory structures 110 are disposed in a predetermined pattern in the X direction and the Y direction. These memory structures 110 function as the memory units MU.

The memory structure 110 includes a semiconductor layer 111 extending in the Z direction, a gate insulating layer 112 disposed between the semiconductor layer 111 and the conductive layers 120, a semiconductor layer 113 connected to a lower end of the semiconductor layer 111 and the surface of the substrate S, and a semiconductor layer 114 connected to an upper end of the semiconductor layer 111.

For example, the semiconductor layer 111 functions as a channel region of the plurality of memory cells MC and the drain select transistor STD included in one memory unit MU (FIG. 1). The semiconductor layer 111 has an approximately columnar shape and has the center part into which an insulating layer 115, such as silicon oxide ($SiO_2$), is embedded. The semiconductor layer 111 is, for example, a semiconductor layer, such as non-doped polycrystalline silicon (Si).

Figure 3:
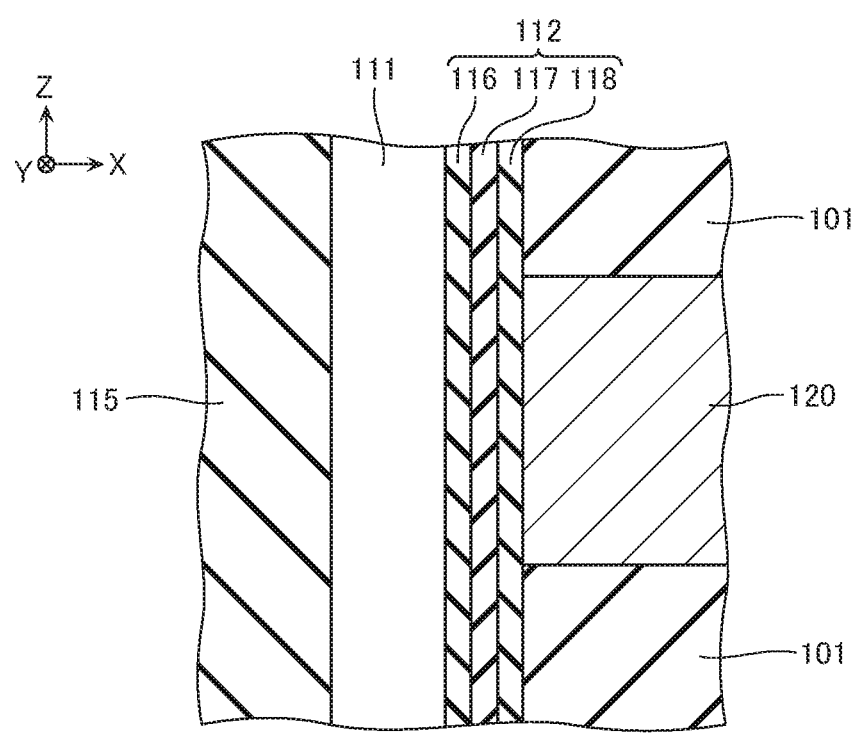
FIG. 3 is a schematic enlarged view of a part indicated by A in FIG. 2.

The gate insulating layer 112 is disposed on respective intersection portions between the semiconductor layer 111 and the conductive layers 120. FIG. 3 is a schematic enlarged view of a part indicated by A in FIG. 2 and illustrates a specific configuration of the intersection portion between the semiconductor layer 111 and the conductive layer 120. For example, as illustrated in FIG. 3, the gate insulating layer 112 includes a tunnel insulating layer 116, an electric charge accumulation layer 117, and a block insulating layer 118 laminated between the semiconductor layer 111 and the conductive layer 120. The tunnel insulating layer 116 and the block insulating layer 118 are insulating layers of, for example, silicon oxide ($SiO_2$). The electric charge accumulation layer 117 is a layer that can accumulate electric charge, such as silicon nitride (SiN).

The semiconductor layer 113 (FIG. 2), for example, functions as a channel region of the source select transistor STS. A gate insulating layer 119 is disposed on an outer peripheral surface of the semiconductor layer 113. The semiconductor layer 113 is a semiconductor layer of, for example, single-crystal silicon (Si). The gate insulating layer 119 is an insulating layer of, for example, silicon oxide.

The semiconductor layer 114 is a semiconductor layer of, for example, polycrystalline silicon (Si) containing N type impurities, such as phosphorus.

The plurality of conductive layers 120 are conductive layers having an approximately plate shape disposed in the Z direction via insulating layers 101, such as silicon oxide, and extending in the X direction and the Y direction. These conductive layers 120 have a plurality of through-holes formed in a predetermined pattern, and the memory structures 110 are each disposed inside the through-holes. Additionally, a contact portion 121 connected to the contact 130 is disposed on an end portion in the X direction of the conductive layer 120. The conductive layer 120 contains, for example, titanium nitride (TiN), tungsten (W), a laminated film of these materials, or the like.

A part of the conductive layers 120a each function as the word lines WL (FIG. 1) and gate electrodes of the plurality of memory cells MC (FIG. 1) connected to the word lines WL.

Conductive layers 120b disposed above these ones functions as the drain select lines SGD (FIG. 1) and gate electrodes of the plurality of drain select transistors STD (FIG. 1) connected to the drain select lines SGD. The conductive layer 120b has a width in the Y direction smaller than that of the conductive layer 120a. Between the conductive layers 120b adjacent in the Y direction, an insulating portion SHE, such as silicon oxide, is disposed.

A conductive layer 120c disposed below these ones functions as the source select line SGS (FIG. 1) and gate electrodes of the plurality of source select transistors STS connected to the source select line SGS. The conductive layer 120c covers the outer peripheral surface of the semiconductor layer 113 via the gate insulating layer 119.

The contacts 130 extend in the Z direction and are connected to the contact portions 121 of the plurality of conductive layers 120. The contact 130 contains, for example, titanium nitride (TiN), tungsten (W), a laminated film of these materials, or the like.

The first structures 140 are, for example, disposed in the contact portion 121 of the conductive layer 120 so as to surround the contact 130. The first structure 140 has a configuration approximately similar to the memory structure 110. However, while the lower end of the semiconductor layer 111 of the memory structure 110 is connected to the semiconductor layer 113, a lower end of the semiconductor layer 111 of the first structure 140 is covered with the gate insulating layer 112. Thus, the semiconductor layer 111 is electrically insulated from the semiconductor layer 113.

The wiring 150 functions as the bit line BL. The plurality of wirings 150 are disposed in the X direction and extend in the Y direction. The wirings 150 are connected to the plurality of memory structures 110 via contacts 151.

Next, with reference to FIG. 4 to FIG. 8, the further specific configurations of the memory cell array MA are described. For convenience of explanation, FIG. 4 to FIG. 8 omit a part of the configuration.

Figure 4:
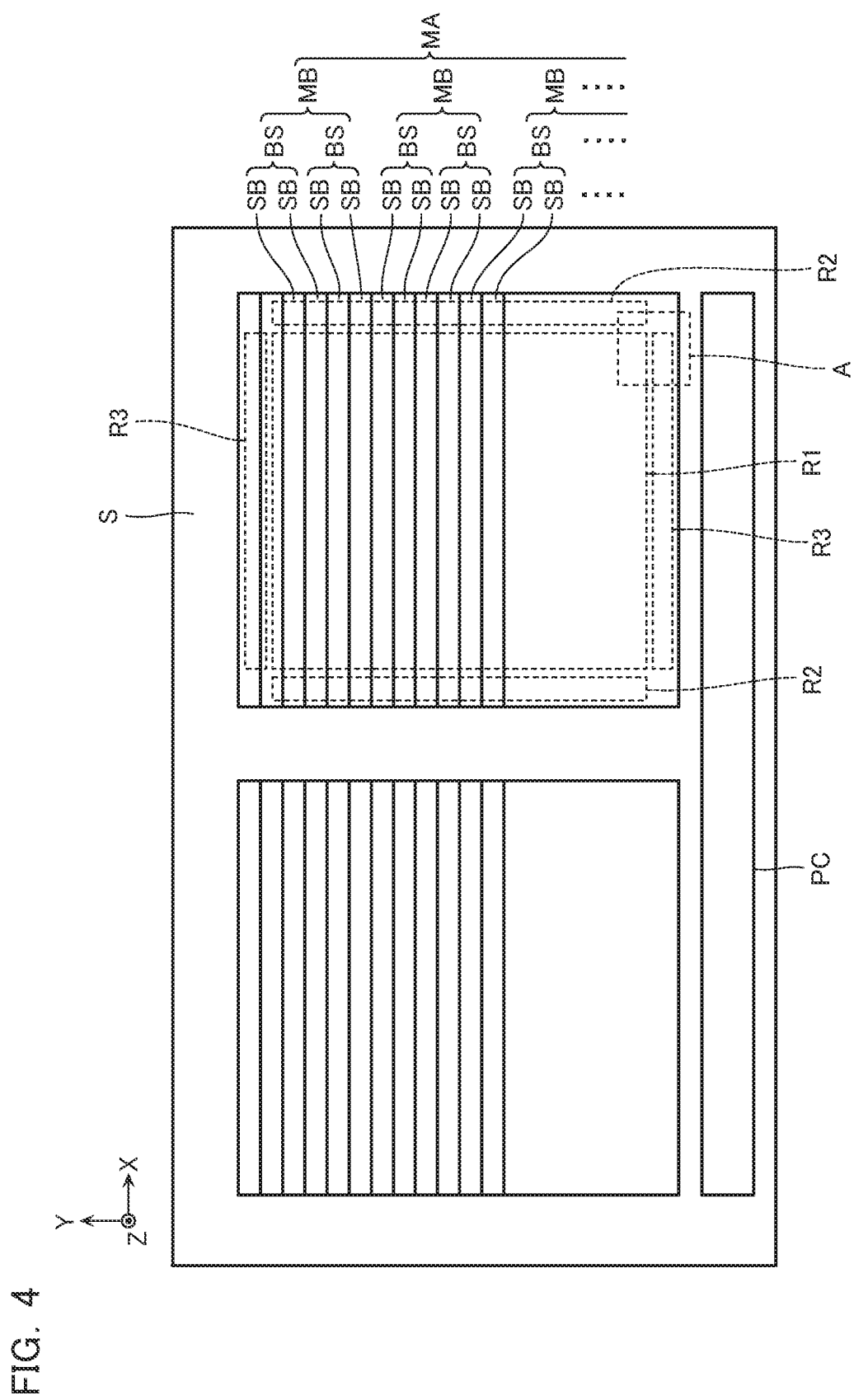
FIG. 4 is a schematic plan view of the semiconductor memory device.

FIG. 4 is a schematic plan view of the semiconductor memory device according to the embodiment.

As illustrated in FIG. 4, the plurality of memory cell arrays MA and the peripheral circuit PC are disposed on the substrate S. In the example illustrated in the drawing, the two memory cell arrays MA are arrayed in the X direction on the substrate S. The memory cell array MA includes the plurality of memory blocks MB disposed in the Y direction. The plurality of memory blocks MB include a plurality of block structures BS disposed in the Y direction. The plurality of block structures BS include the plurality of sub-blocks SB disposed in the Y direction.

The memory cell array MA includes a region R1 in which the memory cells MC are disposed, regions R2 in which the contact 130 and the like are disposed in a staircase pattern, and regions R3 around the memory cell array MA that include the dummy memory cells MC and the like.

Figure 5:
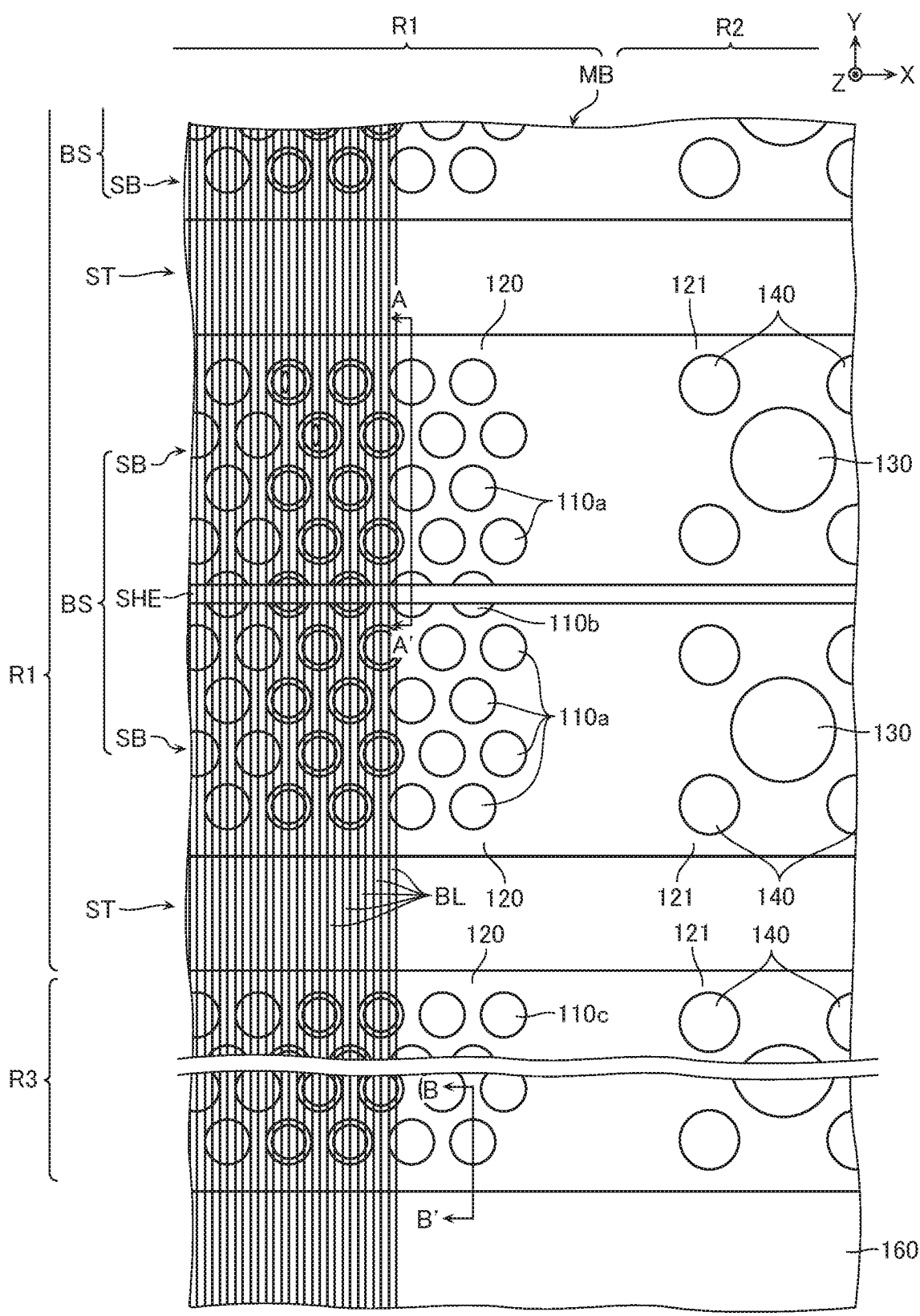
FIG. 5 is a schematic enlarged view of a part indicated by A in FIG. 4.
Figure 6:
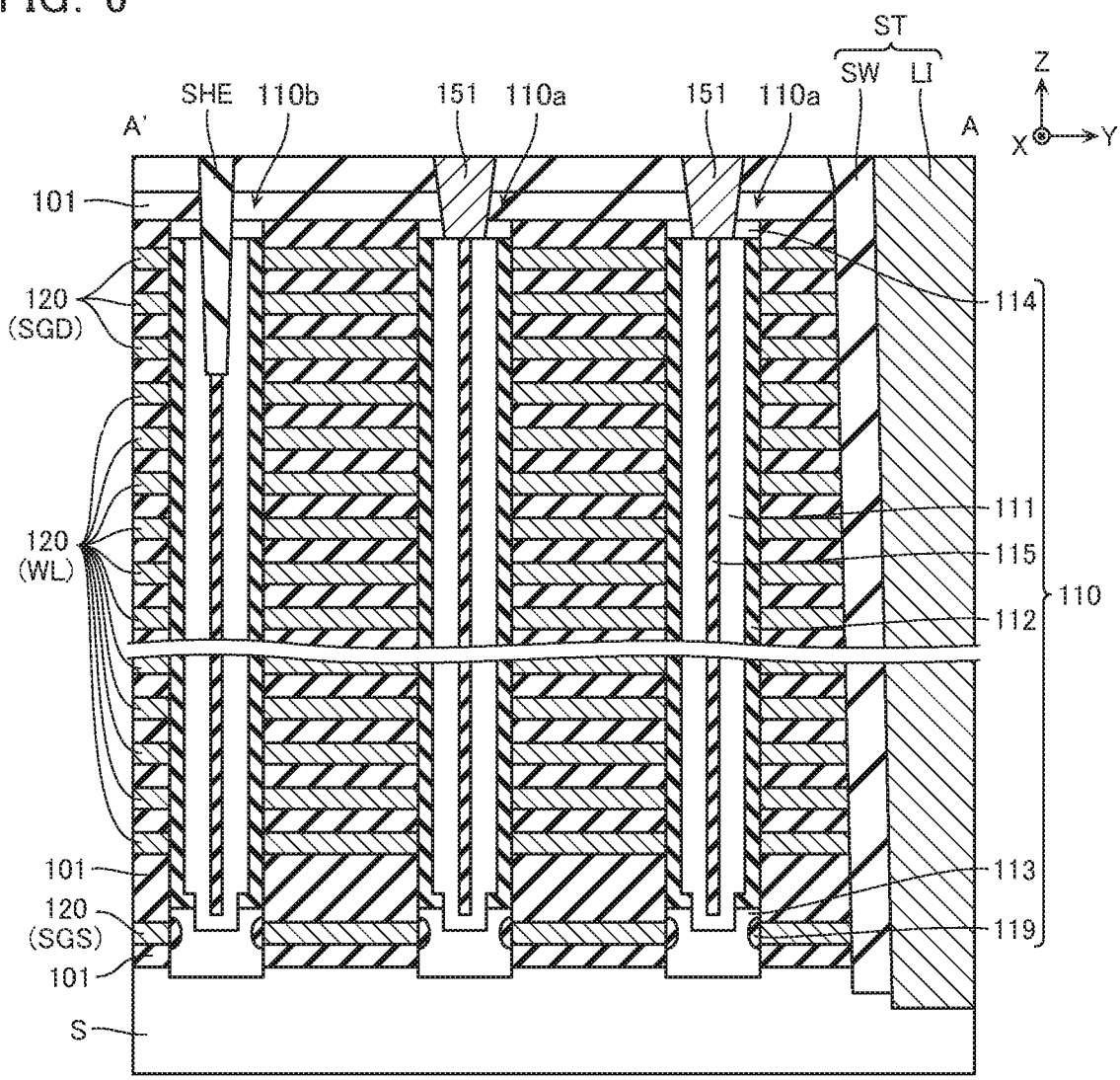
FIG. 6 is a schematic cross-sectional view taking the structure of FIG. 5 along the line A-A'.
Figure 7:
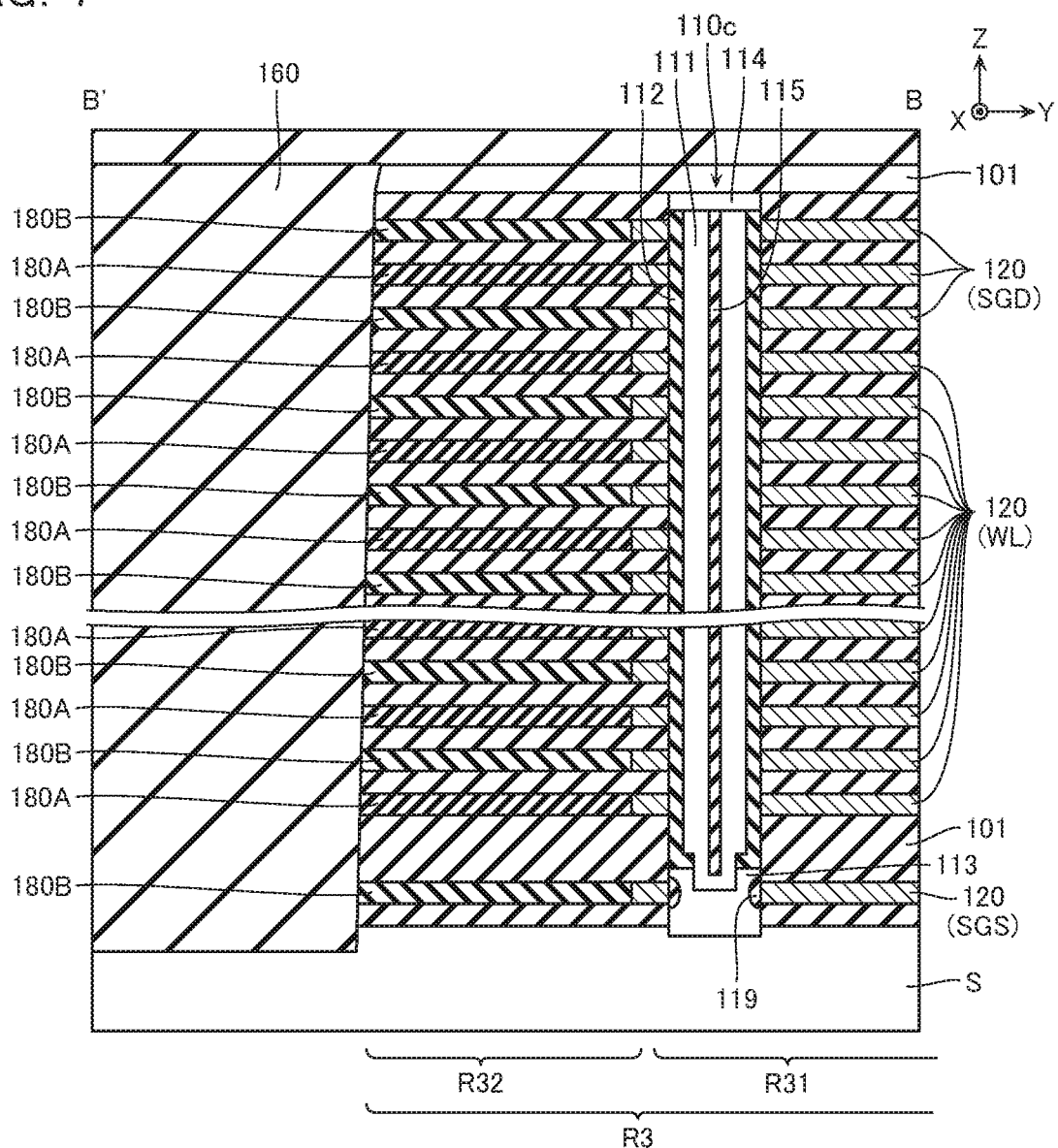
FIG. 7 is a schematic cross-sectional view taking the structure of FIG. 5 along the line B-B'.

FIG. 5 is an enlarged view of the part indicated by A in FIG. 4 and illustrates parts of the regions R1, R2, and R3. FIG. 6 is a schematic cross-sectional view taking the part illustrated in FIG. 5 along the line A-A' and viewed in the arrow direction. FIG. 7 is a schematic cross-sectional view taking the part illustrated in FIG. 5 along the line B-B' and viewed in the arrow direction.

As illustrated in FIG. 5, the region R1 includes the plurality of block structures BS adjacent in the Y direction via an insulating portion ST. The block structures BS each include two sub-blocks SB adjacent in the Y direction via the insulating portion SHE. In each block structure BS, a plurality of memory structures 110*a* are disposed in a staggered pattern.

As illustrated in FIG. 6, the plurality of memory structures 110*a* are mainly electrically connected to the bit lines BL via the contacts 151. The memory structures 110*a* function as the memory units MU (FIG. 1).

In the illustrated example, some of memory structures 110*b* include the insulating portions SHE. As illustrated in FIG. 6, in the memory structure 110*b*, a groove is formed in an upper end part of the semiconductor layer 111, an upper end part of the gate insulating layer 112, and the semiconductor layer 114, and thus the insulating portion SHE is disposed here. The memory structure 110*b* is not electrically connected to the bit line BL and does not function as the memory unit MU. As illustrated in FIG. 5, the plurality of memory structures 110*b* are disposed in the X direction along the insulating portion SHE.

Moreover, as illustrated in FIG. 6, the insulating portion ST includes an electrode unit LI and a sidewall portion SW. The electrode unit LI functions as a connection electrode with the lower wiring SC. The sidewall portion SW functions as a region to insulate between the electrode unit LI and the conductive layer 120, or the like.

As illustrated in FIG. 5, the region R2 includes the contact portions 121 for the conductive layers 120. Each contact portion 121 includes the contact 130. The first structures 140 are disposed near the contact 130. The first structures 140 are electrically insulated from the bit lines BL.

The region R3 includes dummy memory structures 110*c*. The memory structures 110*c* function as dummy structures at the peripheral portion of the memory cell array MA to accurately manufacture the memory structures 110*a* in the region R1 and the like. The dummy memory structures 110*c* do not function as the memory units MU. As illustrated in FIG. 7, the memory structure 110*c* needs not include the contact 151 or the like or may be electrically insulated from the bit line BL.

The cross-sectional view illustrated in FIG. 7 includes an insulating region 160 as an outer region of the memory cell array MA and the region R3 as the peripheral portion of the memory cell array MA. The region R3 includes regions R31 and R32.

The region R31 is a region where a distance from the insulating region 160 is equal to or more than a predetermined distance. The region R31 includes the plurality of conductive layers 120 and the dummy memory structure 110*c*. Top surfaces and lower surfaces of the respective conductive layers 120 are in contact with the insulating layers 101.

The region R32 is a region where a distance from the insulating region 160 is equal to or less than a predetermined distance. The region R32 includes sacrifice layers 180A as first films and sacrifice layers 180B as second films. Top surfaces and lower surfaces of the respective sacrifice layers 180A and 180B are in contact with the insulating layers 101. As illustrated in FIG. 7, side surfaces of the sacrifice layers 180A and 180B are in contact with the conductive layers 120. In the illustrated example, the conductive layer 120, the sacrifice layer 180A, and the sacrifice layer 180B are each made of different materials. For example, the sacrifice layer 180A is made of polycrystalline silicon (Si), and the sacrifice layer 180B is made of silicon nitride (SiN) or the like.

[Manufacturing Method]

Next, the manufacturing method of the semiconductor memory device according to the embodiment will be described with reference to FIG. 8 to FIG. 23. Note that FIGS. 8, 10 to 20, 22, and 23 illustrate cross-sectional surfaces corresponding to the line A-A' in FIG. 5, and FIG. 9 and FIG. 21 illustrate cross-sectional surfaces corresponding to the line B-B' in FIG. 5.

Figure 8:
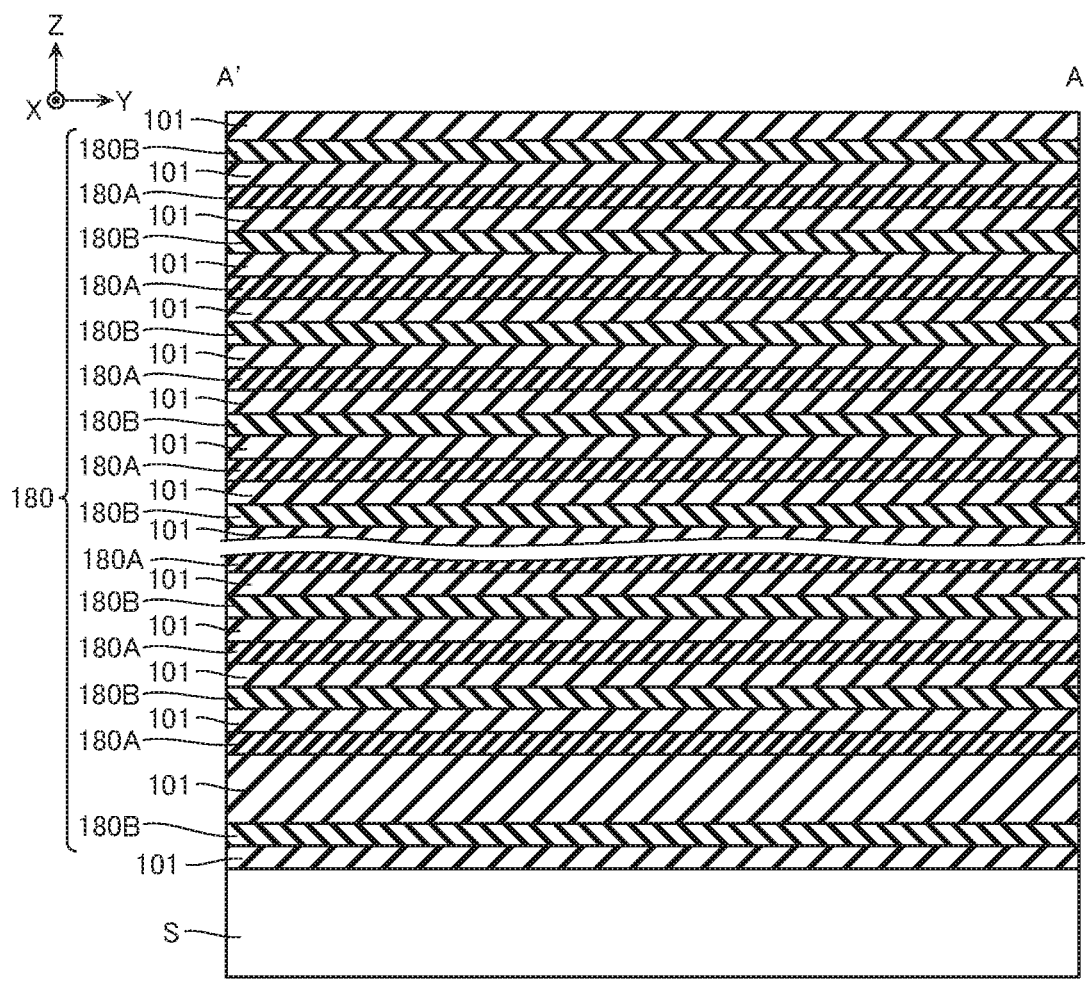
FIG. 8 is a schematic cross-sectional view illustrating a manufacturing method of the semiconductor memory device.

As illustrated in FIG. 8, the manufacturing method forms the plurality of insulating layers 101 and the plurality of sacrifice layer 180 in alternation on the substrate S. The sacrifice layer 180 includes the sacrifice layers 180A as the first films and the sacrifice layers 180B as the second films. In the example, one sacrifice layer 180B is always disposed between the sacrifice layer 180A and the sacrifice layer 180A. In other words, the plurality of sacrifice layers 180A and 180B are arranged in alternation in the Z direction between which the insulating layers 101 are interposed. The insulating layer 101, the sacrifice layer 180A, and the sacrifice layer 180B are each made of different materials. The insulating layer 101 is made of, for example, silicon oxide ($SiO_2$). The sacrifice layer 180A is made of, for example, polycrystalline silicon (Si). The sacrifice layer 180B is made of, for example, silicon nitride (SiN). The process is performed by a method, such as Chemical Vapor Deposition (CVD).

Figure 9:
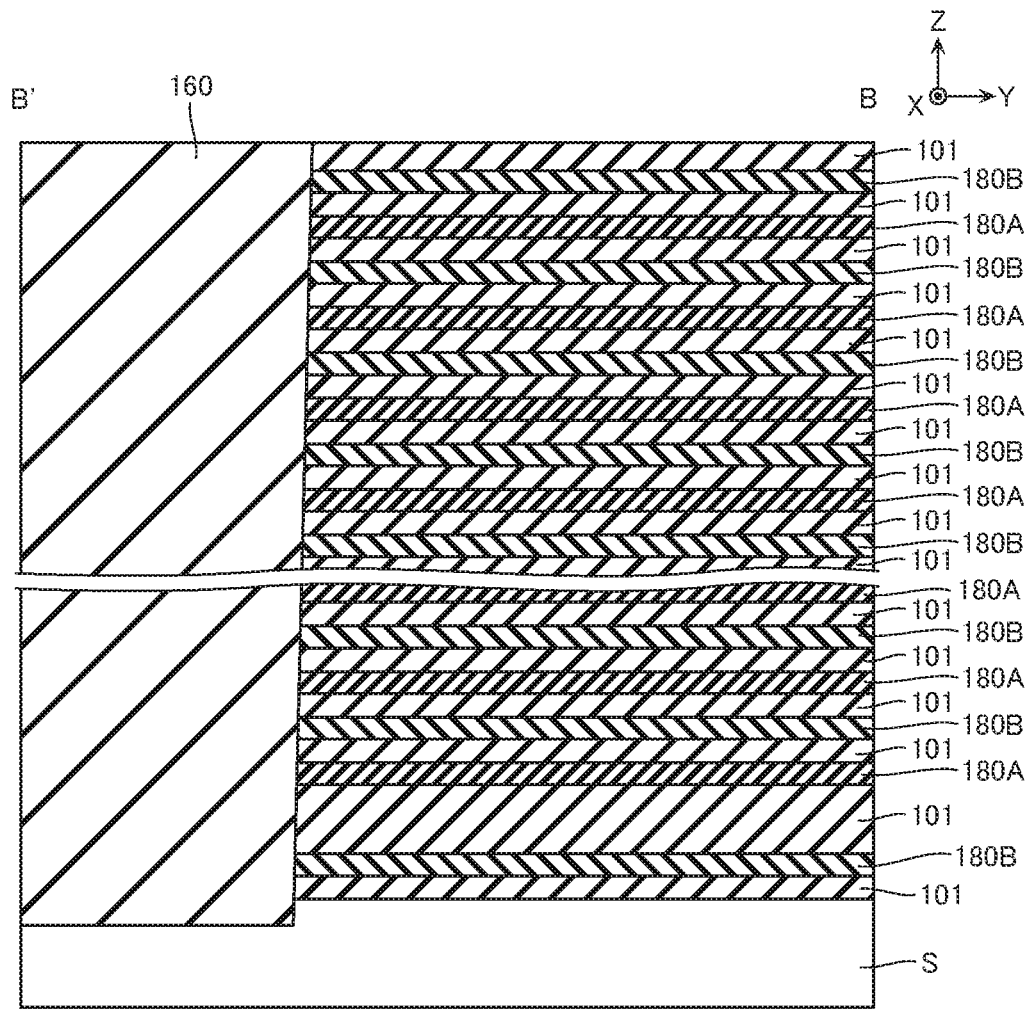
FIG. 9 is a schematic cross-sectional view illustrating the manufacturing method.

Next, as illustrated in FIG. 9, in the stacked structure formed of the insulating layers 101, the sacrifice layers 180A, and the sacrifice layers 180B, a part where the insulating region 160 is to be formed is removed. Afterwards, the insulating region 160 is formed on the removed part. The process of removing the stacked structure is performed by a method, such as Reactive Ion Etching (RIE) or wet etching. The process of forming the insulating region 160 is performed by a method, such as CVD. At this time, an end portion on the region R2 (FIG. 5) side of the stacked structure is processed into, for example, a staircase pattern.

Figure 10:
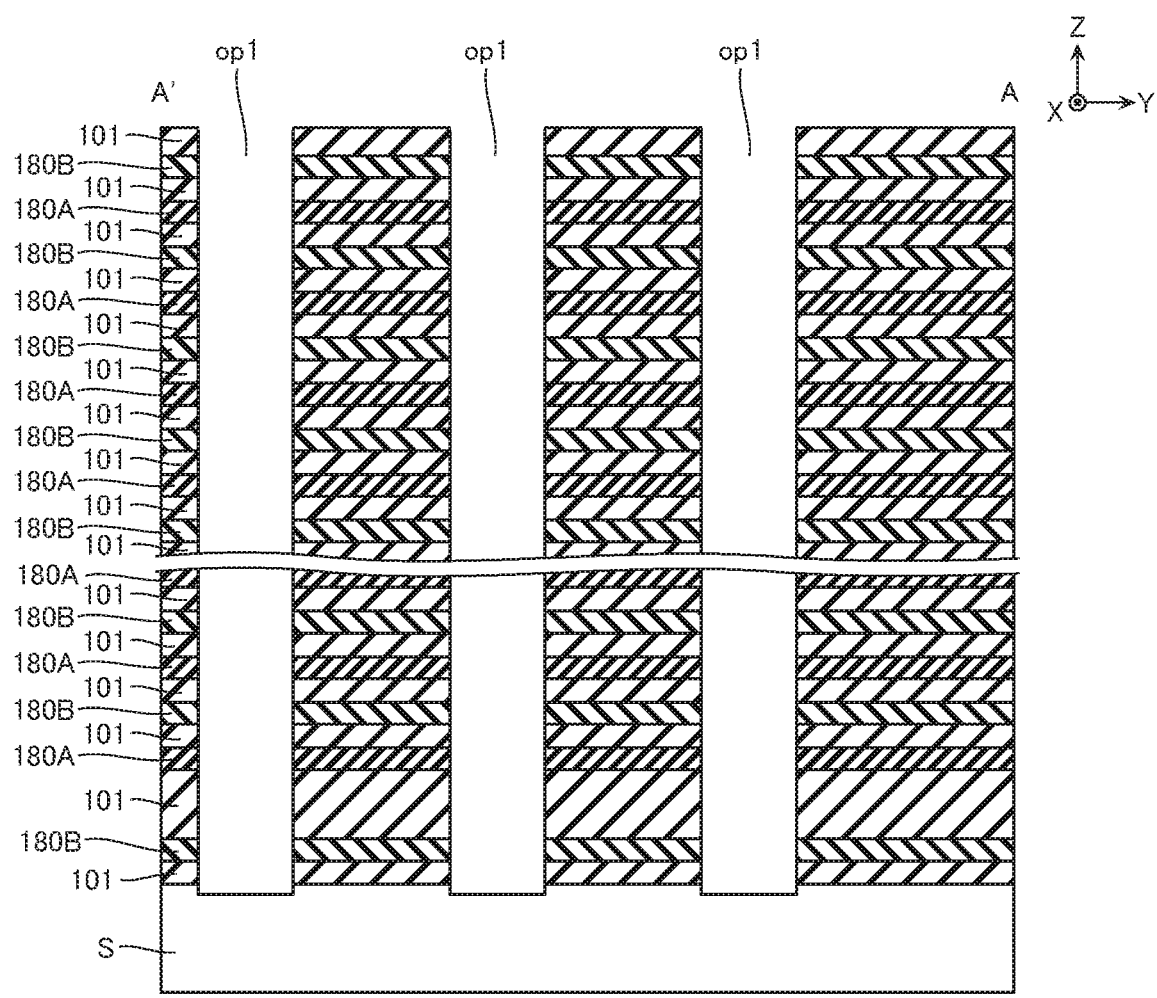
FIG. 10 is a schematic cross-sectional view illustrating the manufacturing method.

Next, as illustrated in FIG. 10, in the stacked structure, a plurality of openings op1 are formed in positions where the memory structures 110*a*, 110*b*, and 110*c* are to be formed. The opening op1 is a hole that extends in the Z direction and penetrates the insulating layers 101, the sacrifice layers 180A and 180B to expose the top surface of the substrate S. The process is performed by a method, such as RIE.

Figure 11:
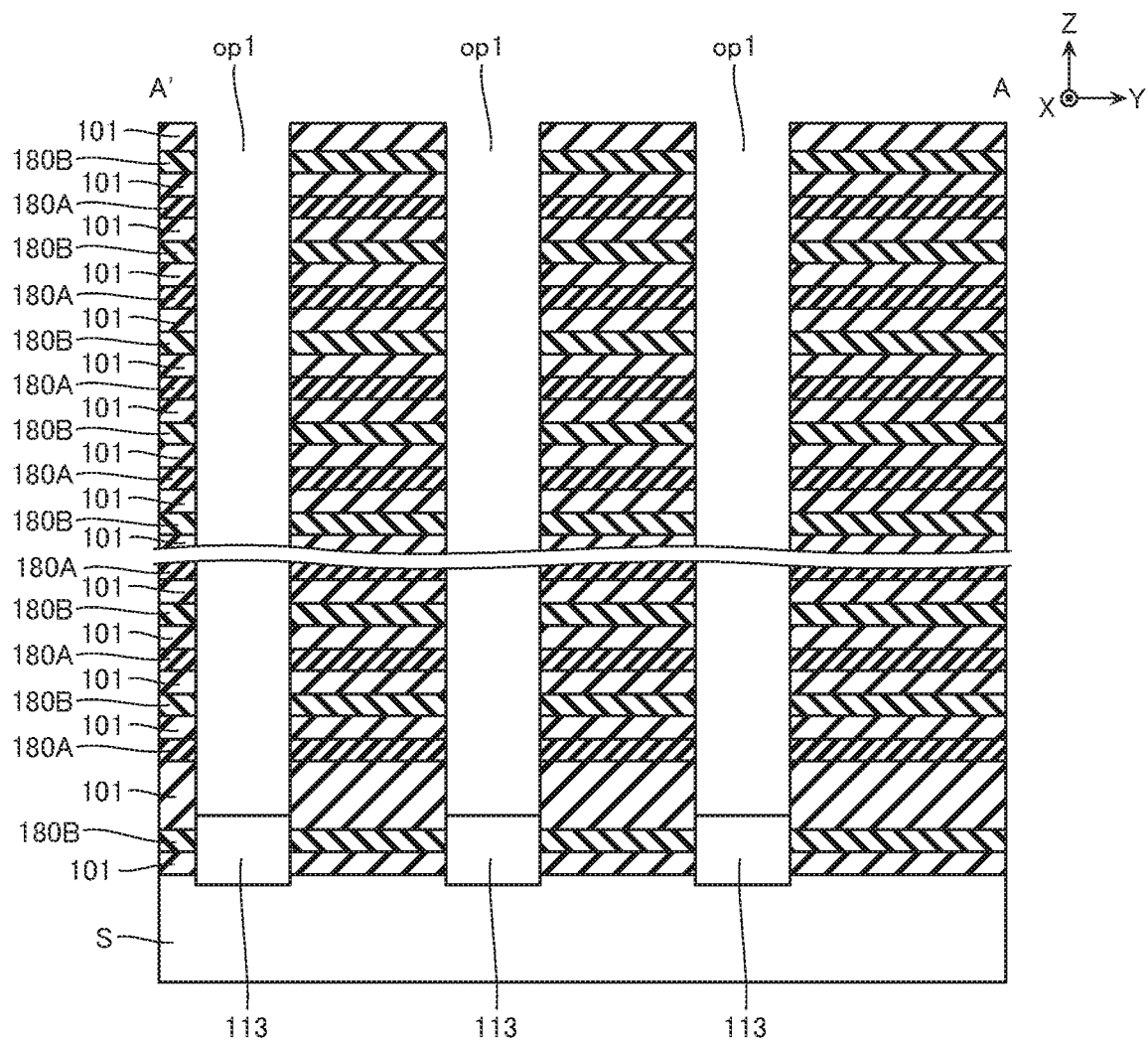
FIG. 11 is a schematic cross-sectional view illustrating the manufacturing method.

Next, as illustrated in FIG. 11, the semiconductor layers 113 are formed on bottom surfaces of the openings op1. The process is performed by a method, such as epitaxial growth.

Figure 12:
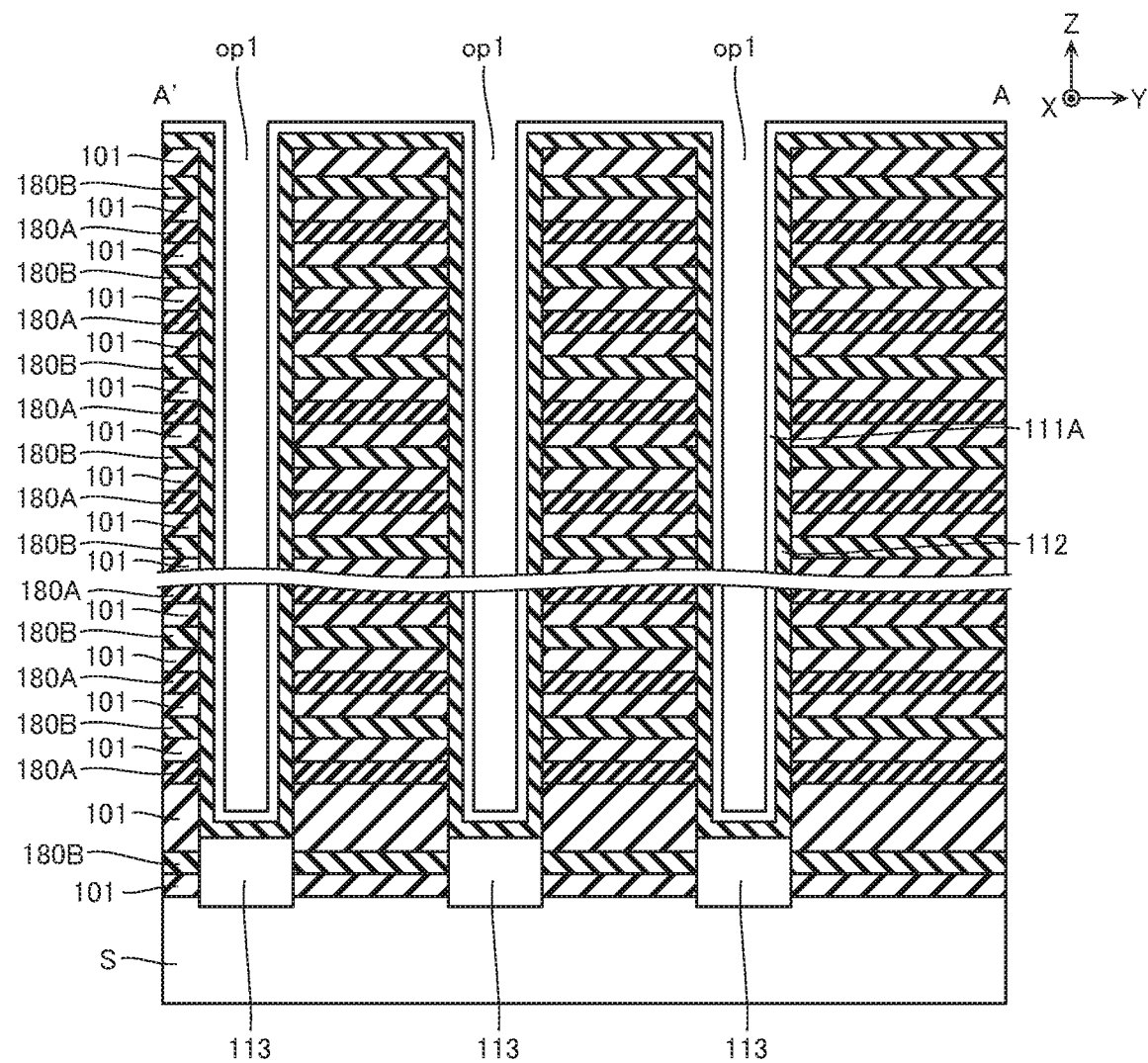
FIG. 12 is a schematic cross-sectional view illustrating the manufacturing method.

Next, as illustrated in FIG. 12, the gate insulating layer 112 and an amorphous silicon layer 111A are formed on the top surface of the semiconductor layer 113 and the inner peripheral surface of the opening op1. The process is performed by a method, such as CVD.

Figure 13:
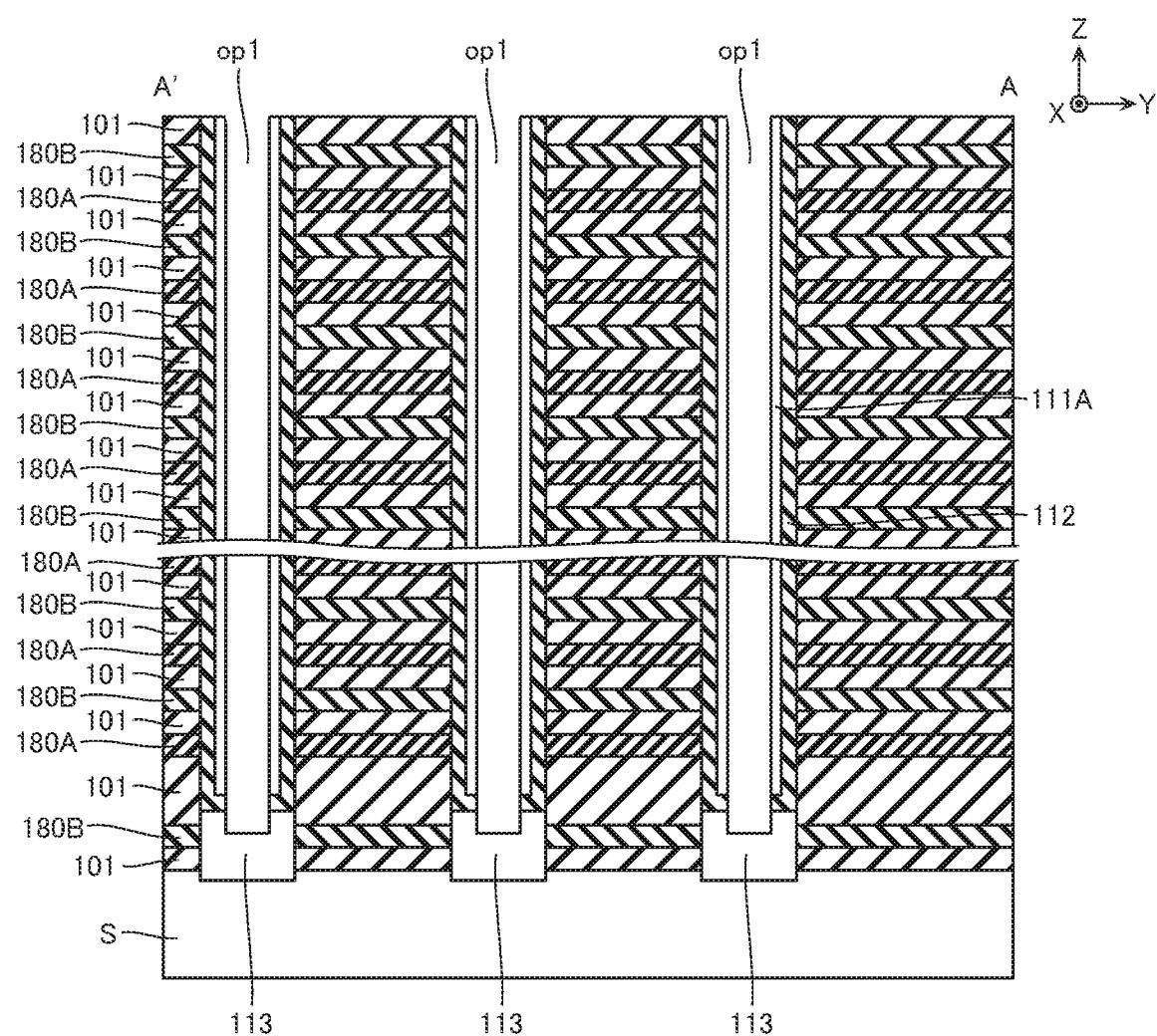
FIG. 13 is a schematic cross-sectional view illustrating the manufacturing method.

Next, as illustrated in FIG. 13, parts covering the top surface of the semiconductor layer 113 of the gate insulating layer 112 and the amorphous silicon layer 111A are removed. The process is performed by a method, such as RIE.

Figure 14:
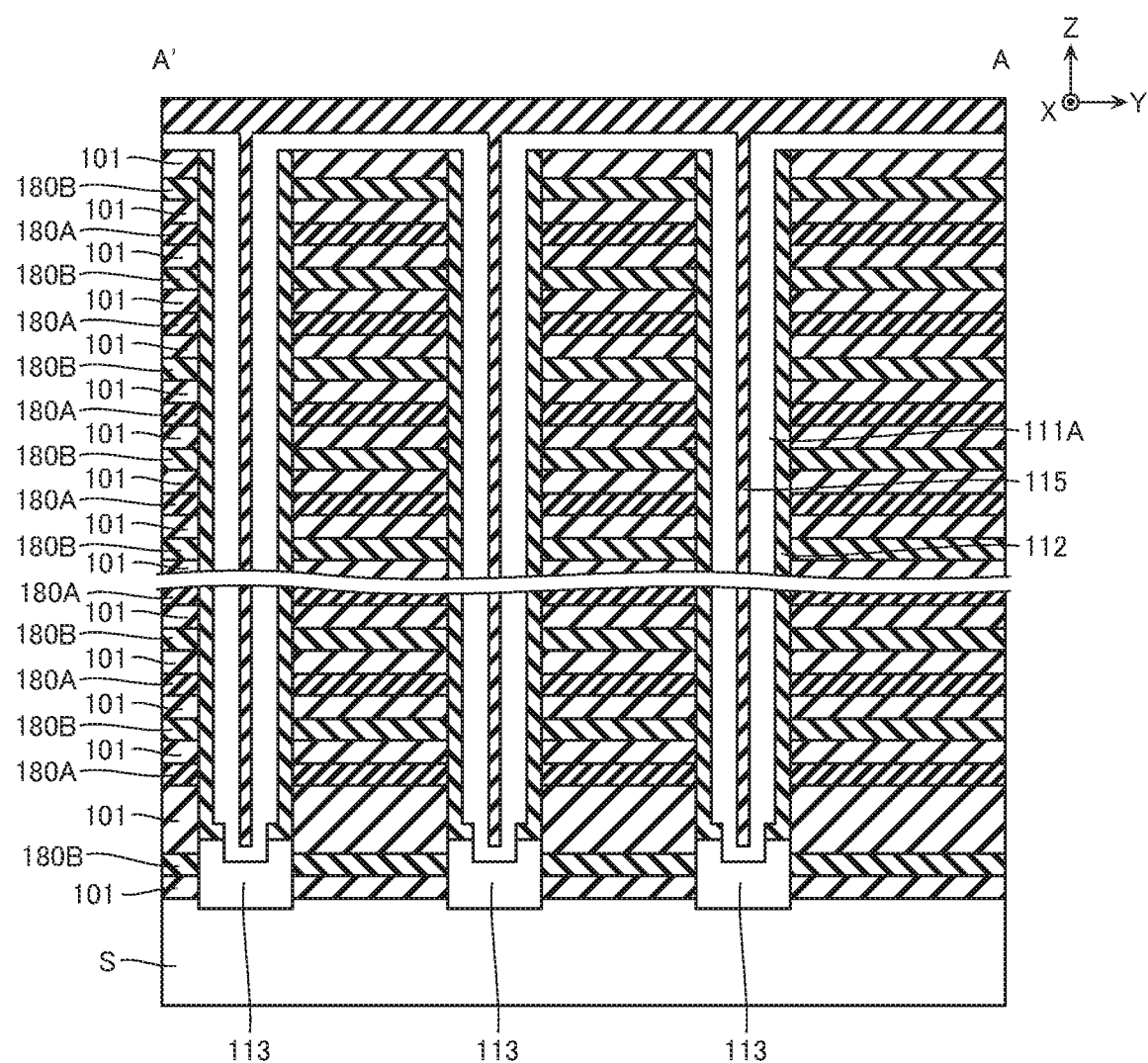
FIG. 14 is a schematic cross-sectional view illustrating the manufacturing method.

Next, as illustrated in FIG. 14, the amorphous silicon layer 111A and the insulating layer 115 are formed on the top surface of the semiconductor layer 113 and the inner peripheral surface of the amorphous silicon layer 111A. The process is performed by a method, such as CVD. Afterwards, a crystalline structure of the amorphous silicon layer 111A is modified by, for example, annealing process to form the semiconductor layer 111 (FIG. 15).

Figure 15:
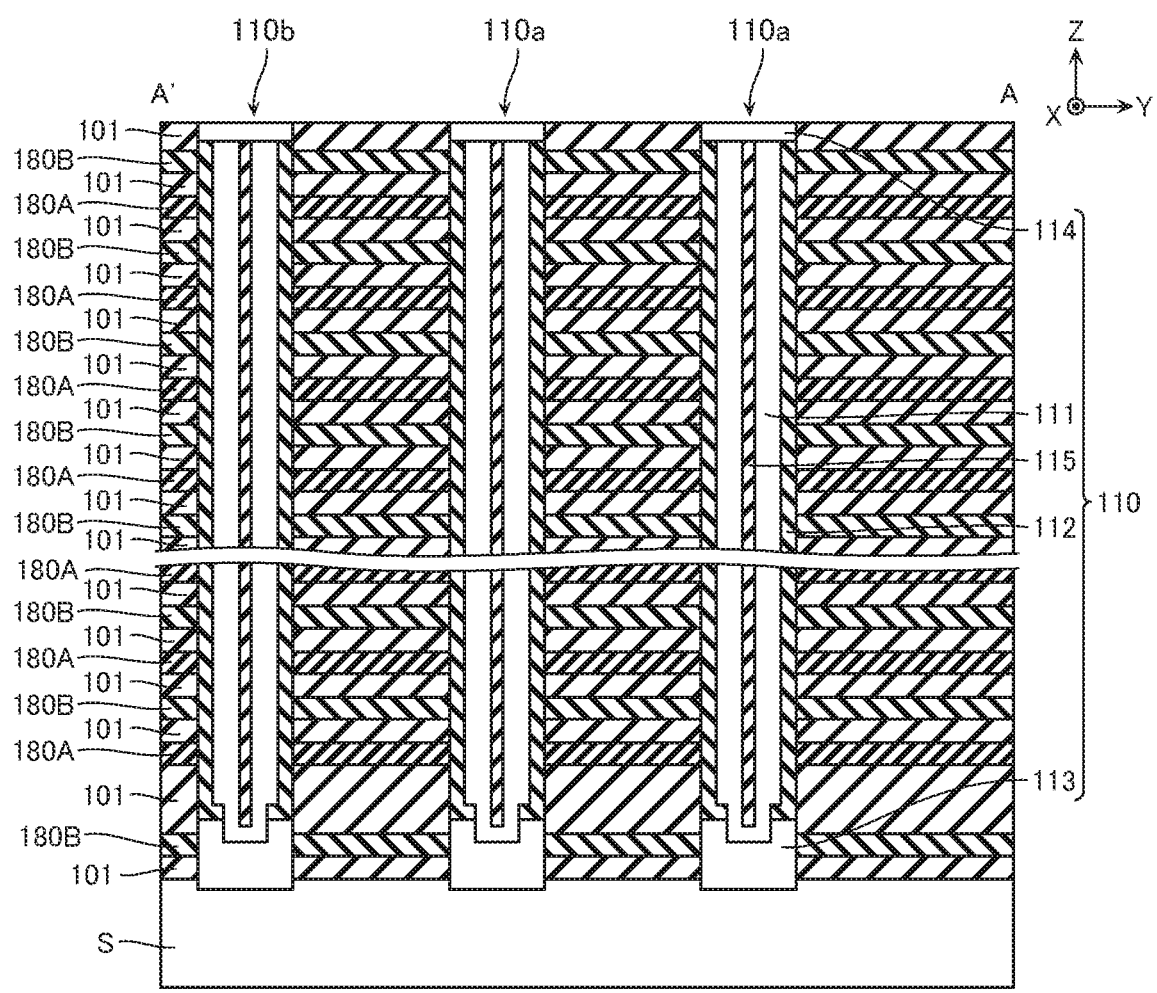
FIG. 15 is a schematic cross-sectional view illustrating the manufacturing method.

Next, as illustrated in FIG. 15, a part of the insulating layer 115, the semiconductor layer 111, and the gate insulating layer 112 are removed to expose the insulating layer 101 positioned as the uppermost layer. Additionally, semiconductor layers 114 are formed near upper ends of the openings op1. This forms the memory structures 110a and 110b having an approximately columnar shape. The process is performed by a method, such as RIE and CVD.

Figure 16:
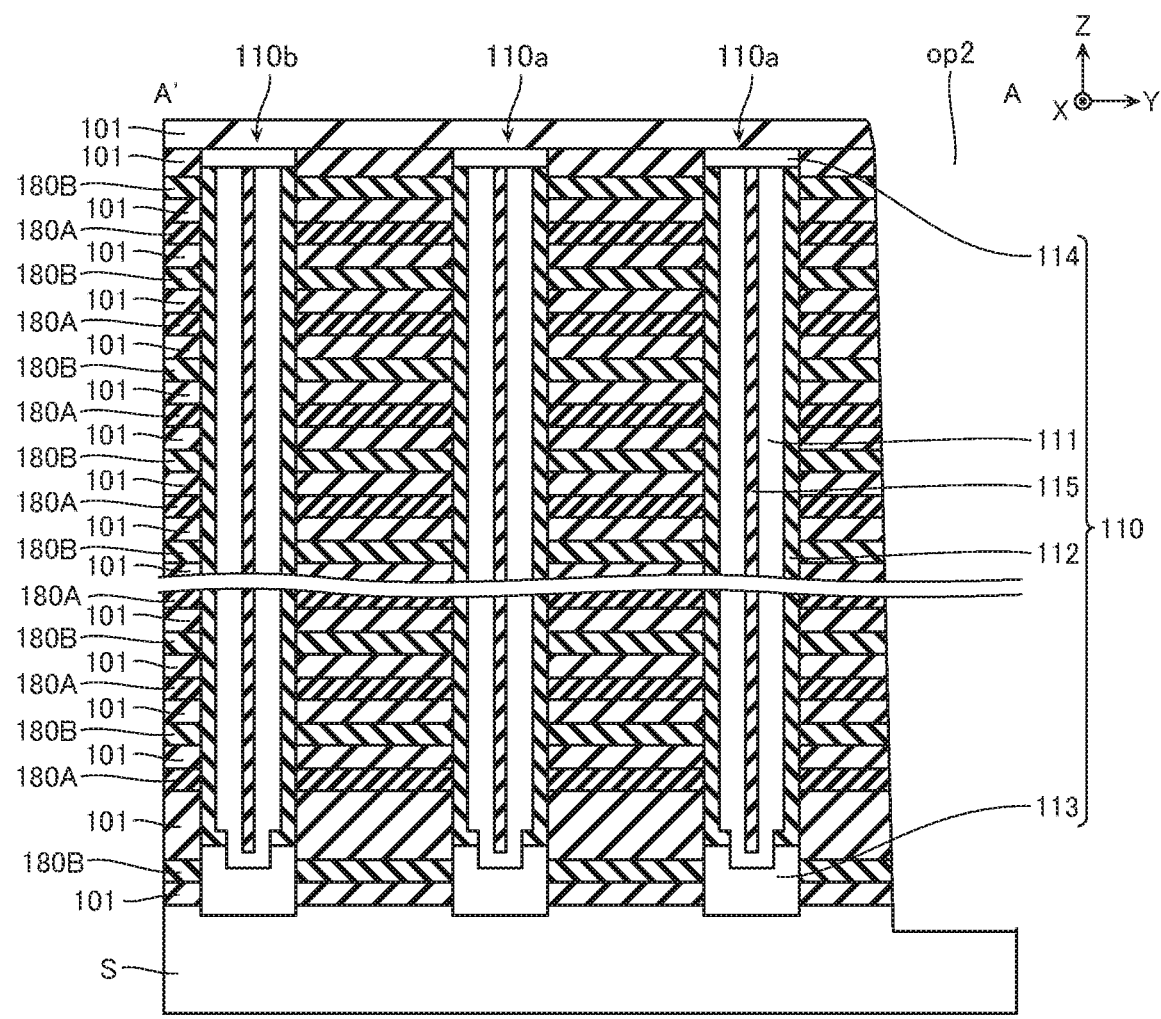
FIG. 16 is a schematic cross-sectional view illustrating the manufacturing method.

Next, as illustrated in FIG. 16, an opening op2 is formed. The opening op2 is a groove extending in the Z direction and the X direction to divide the insulating layer 101, the sacrifice layer 180A, and the sacrifice layer 180B in the Y direction and expose the top surface of the substrate S. The process is performed by a method, such as RIE.

Next, an insulating layer 102 is formed on a bottom surface of the opening op2. Specifically, for example, an oxide film is formed on the sidewall surface and the bottom surface of the opening op2 by, for example, thermal oxidation. Since silicon (Si) of the exposed substrate S is oxidized at a high rate on the bottom surface of the opening op2, the thicker oxide film is formed on the bottom surface of the opening op2.

Figure 17:
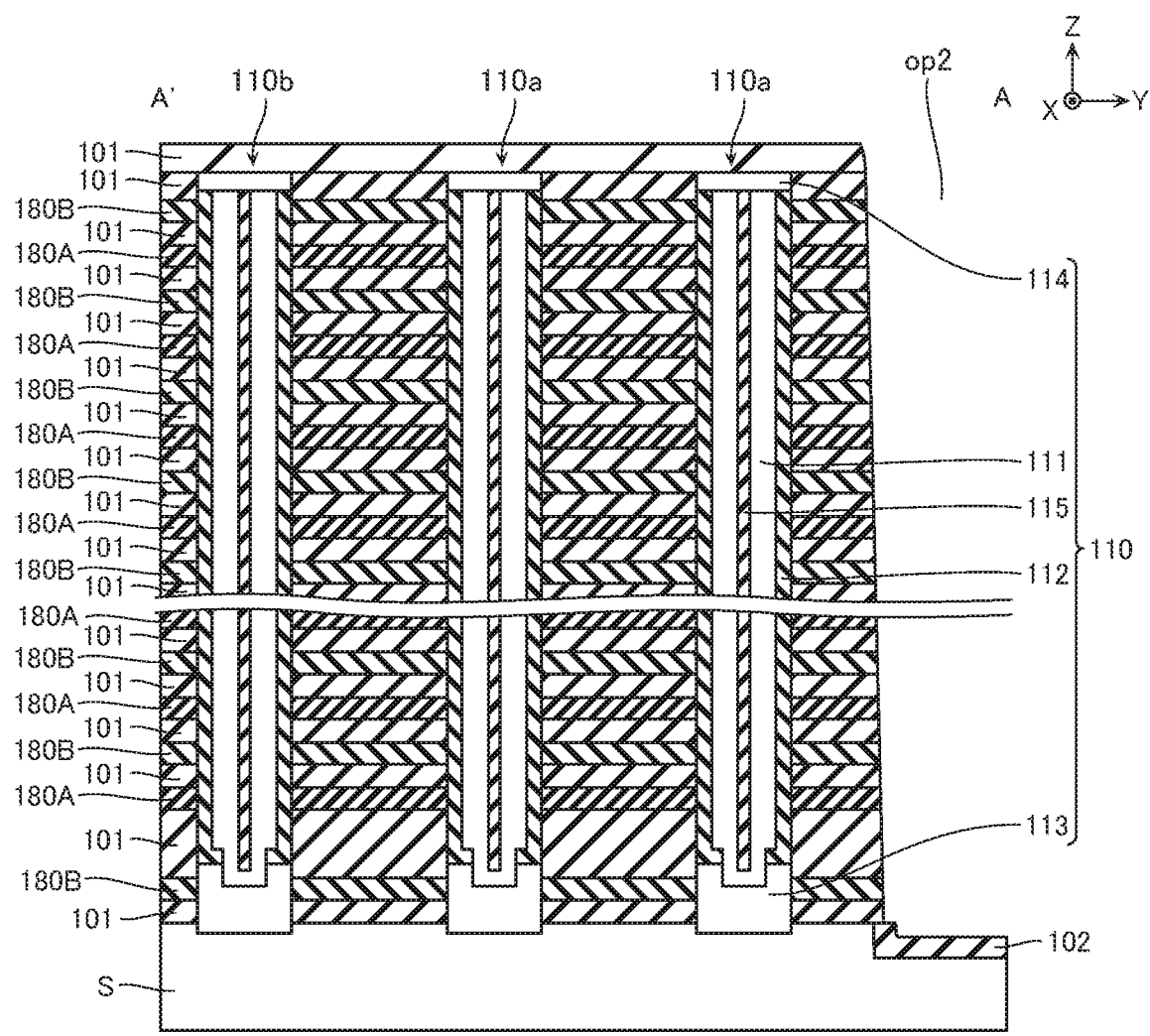
FIG. 17 is a schematic cross-sectional view illustrating the manufacturing method.

Next, the oxide film is removed from a part other than the bottom surface of the opening op2. The oxide film on the bottom surface of the opening op2 is thicker than the oxide film on the sidewall surface. Accordingly, as illustrated in FIG. 17, the insulating layer 102 made of the oxide film can be caused to remain only in the bottom surface of the opening op2 and the part other than that can be removed. The process is performed by a method, such as wet etching, using diluted hydrofluoric acid (DHF).

Figure 18:
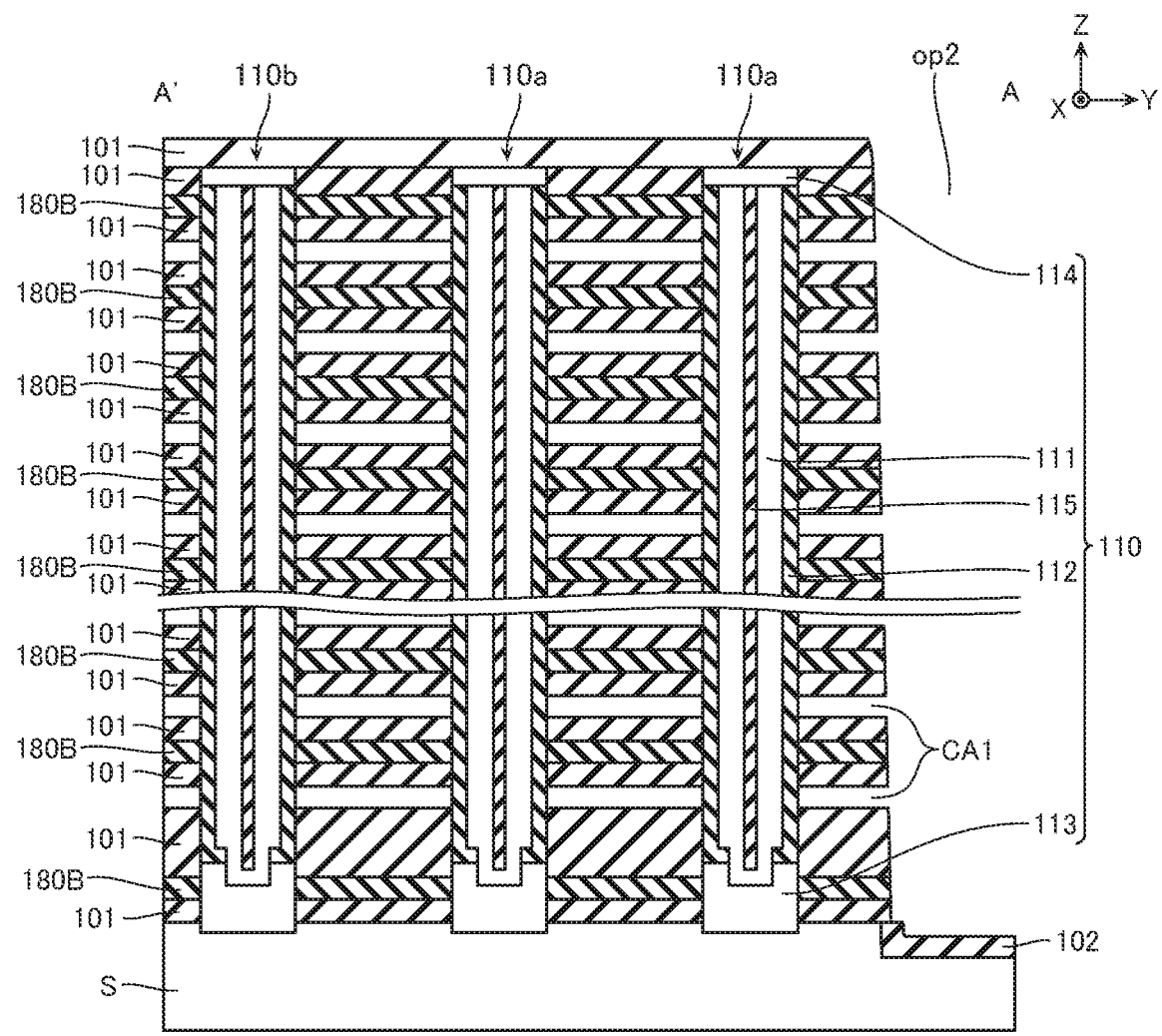
FIG. 18 is a schematic cross-sectional view illustrating the manufacturing method.

Next, as illustrated in FIG. 18, the plurality of sacrifice layers 180A are removed via the opening op2 to form first cavities CA1. Thus, a hollow structure including the plurality of insulating layers 101 and the plurality of sacrifice layers 180B disposed in the Z direction, and the memory structures 110a, 110b, and 110c supporting the insulating layers 101 and the sacrifice layers 180B is formed. The process is performed by a method, such as wet etching, using a first chemical solution as follows.

As the first chemical solution, one that exhibits satisfactory etch selectivity where an etching rate for the sacrifice layer 180A is sufficiently high but an etching rate for the insulating layer 101 and the sacrifice layer 180B is sufficiently low is used. For example, when the sacrifice layer 180A is polycrystalline silicon (Si) and the sacrifice layer 180B is silicon nitride (SiN), a choline solution (TMY) or the like may be used as the first chemical solution.

Figure 19:
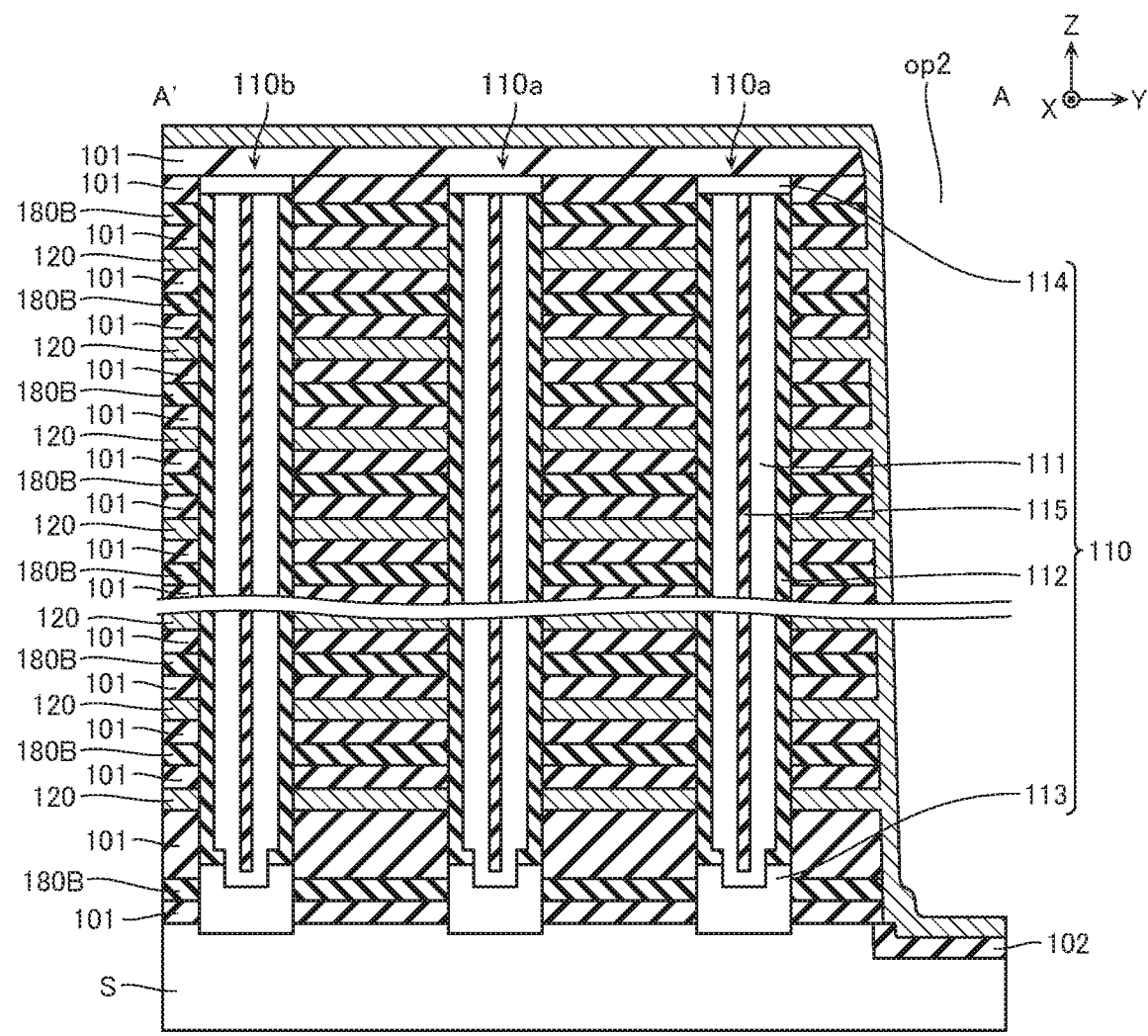
FIG. 19 is a schematic cross-sectional view illustrating the manufacturing method.

Next, as illustrated in FIG. 19, parts of the plurality of conductive layers 120 (first conductive layers) are formed in the first cavities CA1 formed by removing the sacrifice layers 180A. The conductive layer 120 is formed by a method, such as CVD.

Figure 20:
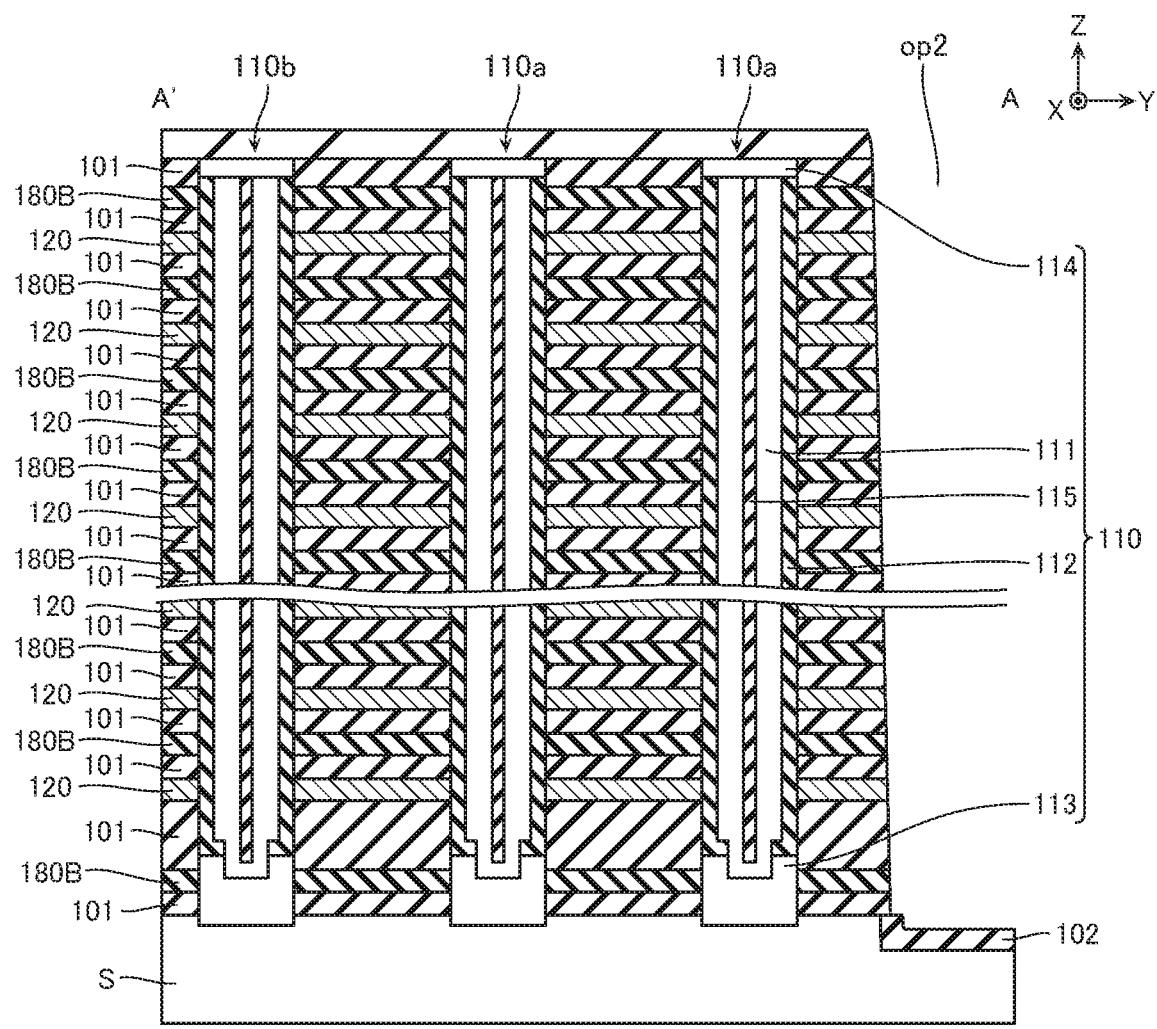
FIG. 20 is a schematic cross-sectional view illustrating the manufacturing method.
Figure 21:
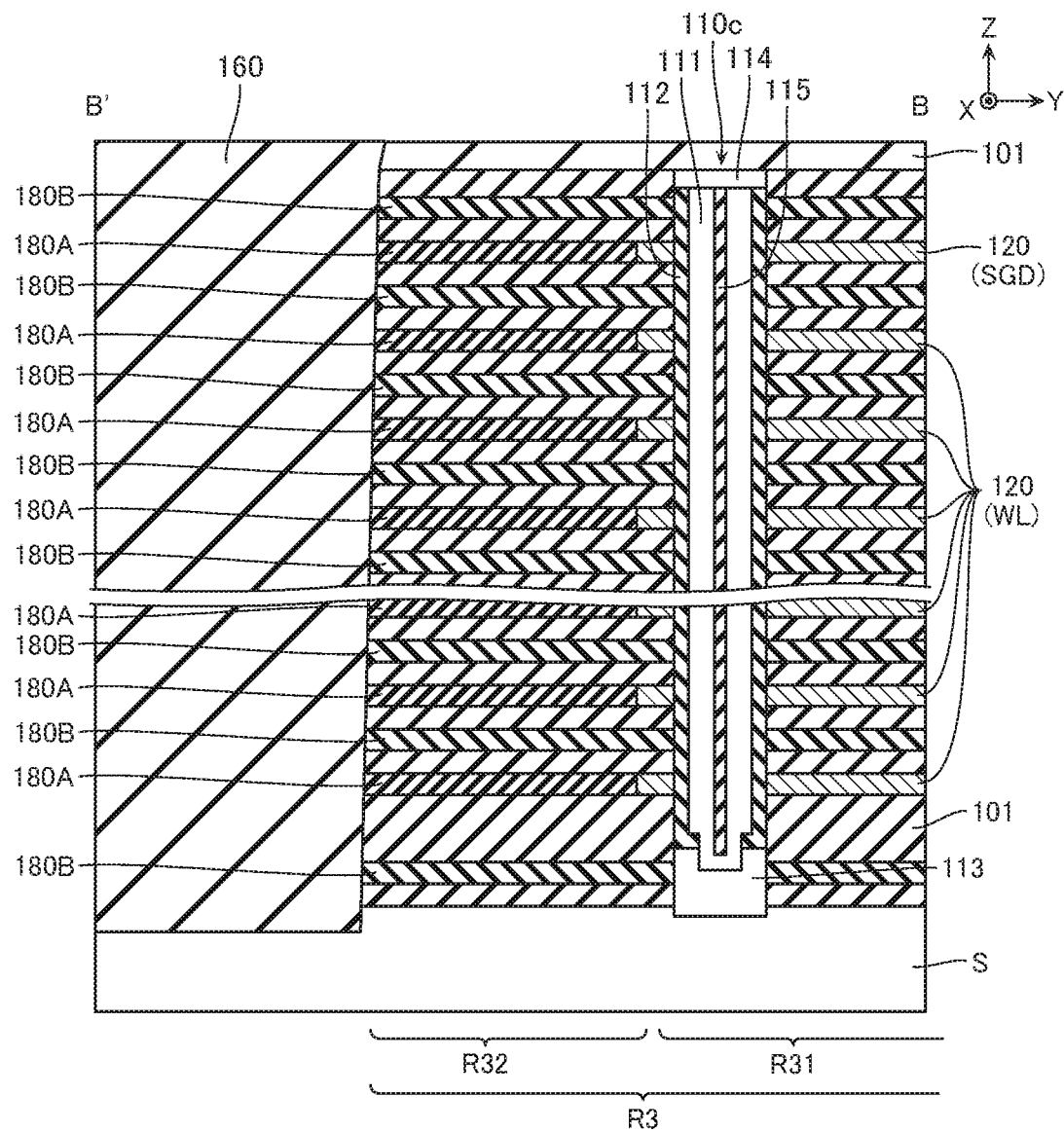
FIG. 21 is a schematic cross-sectional view illustrating the manufacturing method.

Next, as illustrated in FIG. 20, the conductive layer 120 that covers the top surface of the insulating layer 101 and the sidewall surface of the opening op2 formed simultaneously with the formation of parts of the plurality of conductive layers 120 are removed. The process is performed by a method, such as wet etching.

Note that FIG. 21 is a cross-sectional view corresponding to the line B-B' in FIG. 5 when the process is performed up to the above-described process. In FIG. 21 as well, parts of the plurality of sacrifice layers 180A are removed and the conductive layers 120 are formed in the region R31. However, the plurality of sacrifice layers 180A are not removed but remain in the region R32.

That is, in removal of the plurality of sacrifice layers 180A, etching proceeds from the right direction in FIG. 21 via the opening op2 (not illustrated). However, since an opening is absent on the insulating region 160 side, which is in the left direction in FIG. 21, the etching of the sacrifice layers 180A does not proceed from the insulating region 160 side. Accordingly, the sacrifice layers 180A are not removed but remain in the region R32. In view of this, the conductive layers 120 and the sacrifice layers 180A, which are the films of different materials, are each formed adjacent to one another in the regions R31 and R32.

Figure 22:
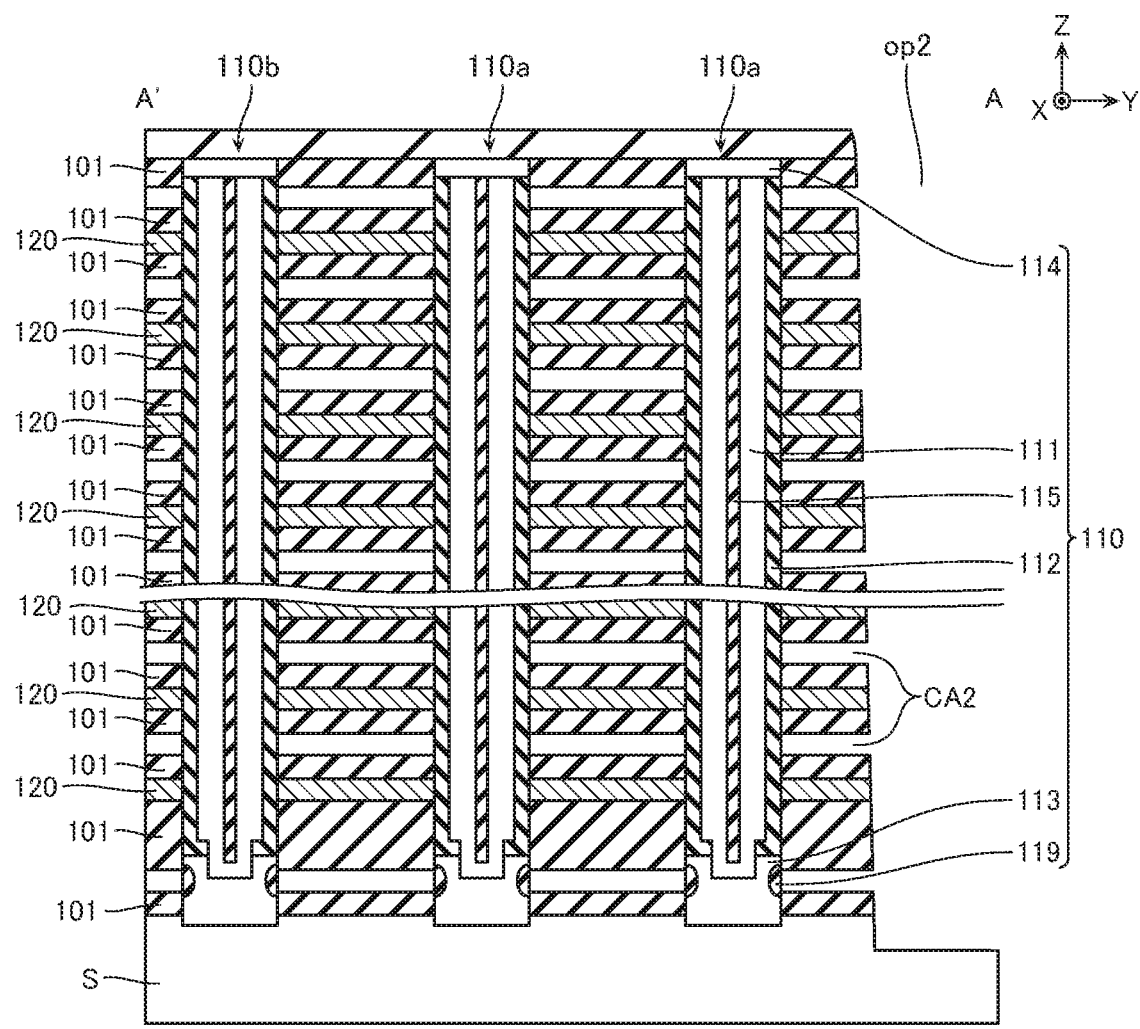
FIG. 22 is a schematic cross-sectional view illustrating the manufacturing method.

Next, as illustrated in FIG. 22, the insulating layer 102 is removed from the bottom surface portion of the opening op2. Afterwards, the plurality of sacrifice layers 180B are removed via the opening op2, thus forming second cavities CA2. The insulating layer 102 is removed by a method, such as wet etching, using diluted hydrofluoric acid (DHF). The sacrifice layers 180B are removed by a method, such as wet etching, using a second chemical solution as follows.

As the second chemical solution, one that exhibits satisfactory etch selectivity where the etching rate for the sacrifice layer 180B is sufficiently high but an etching rate for the insulating layer 101 and the conductive layer 120 is sufficiently low is used. For example, when the sacrifice layer 180B is silicon nitride (SiN), phosphoric acid ($H_3PO_4$) or the like may be used as the second chemical solution.

Next, the gate insulating layers 119 are formed. The gate insulating layer 119 is formed by a method, such as oxidized treatment.

Figure 23:
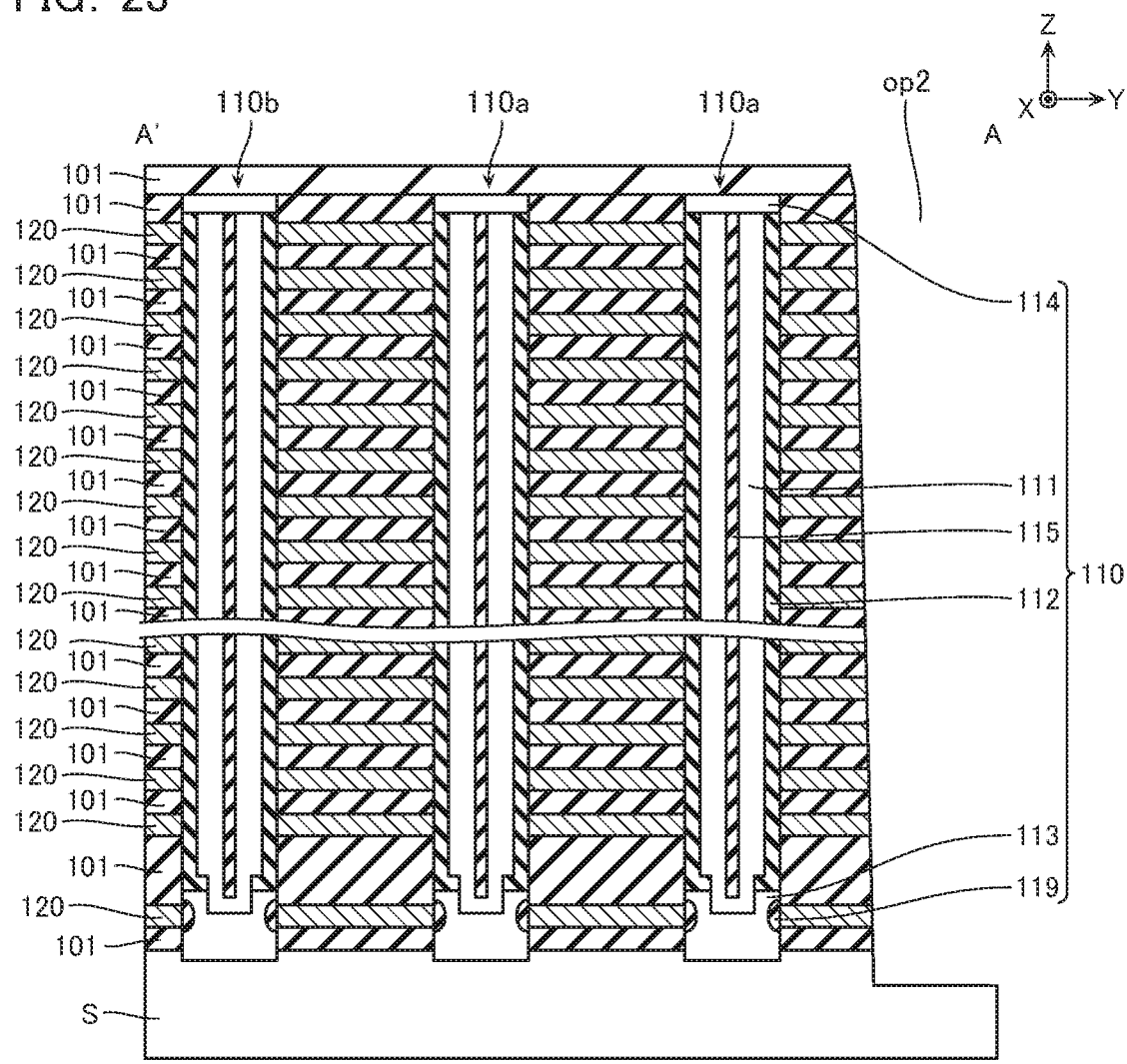
FIG. 23 is a schematic cross-sectional view illustrating the manufacturing method.

Next, similarly to the above-described process of forming the plurality of conductive layers 120 in the first cavities CA1, parts of the plurality of conductive layers 120 (second conductive layers) are formed in the second cavities CA2 formed by removing the sacrifice layers 180B. Thus, the structure of FIG. 23 is formed.

Afterwards, by disposing the electrode unit LI and the sidewall portion SW in the opening op2, the contacts 151 on the upper portions of the memory structures 110a, and the insulating portion SHE on the upper portion of the memory structure 110b, the configuration that has been described with reference to FIG. 6 is formed.

FIG. 7 is a cross-sectional view corresponding to the line B-B' in FIG. 5 when the process has been performed up to the above-described process. In FIG. 7 as well, parts of the plurality of sacrifice layers 180B are removed in the region R31 and the conductive layers 120 are formed. However, the plurality of sacrifice layers 180B are not removed but remain in the region R32. Similarly to the process in the sacrifice layers 180A, since the sacrifice layers 180B are not etched from the left side direction of FIG. 7, such a cross-sectional structure is formed as well.

Effects

Figure 24:
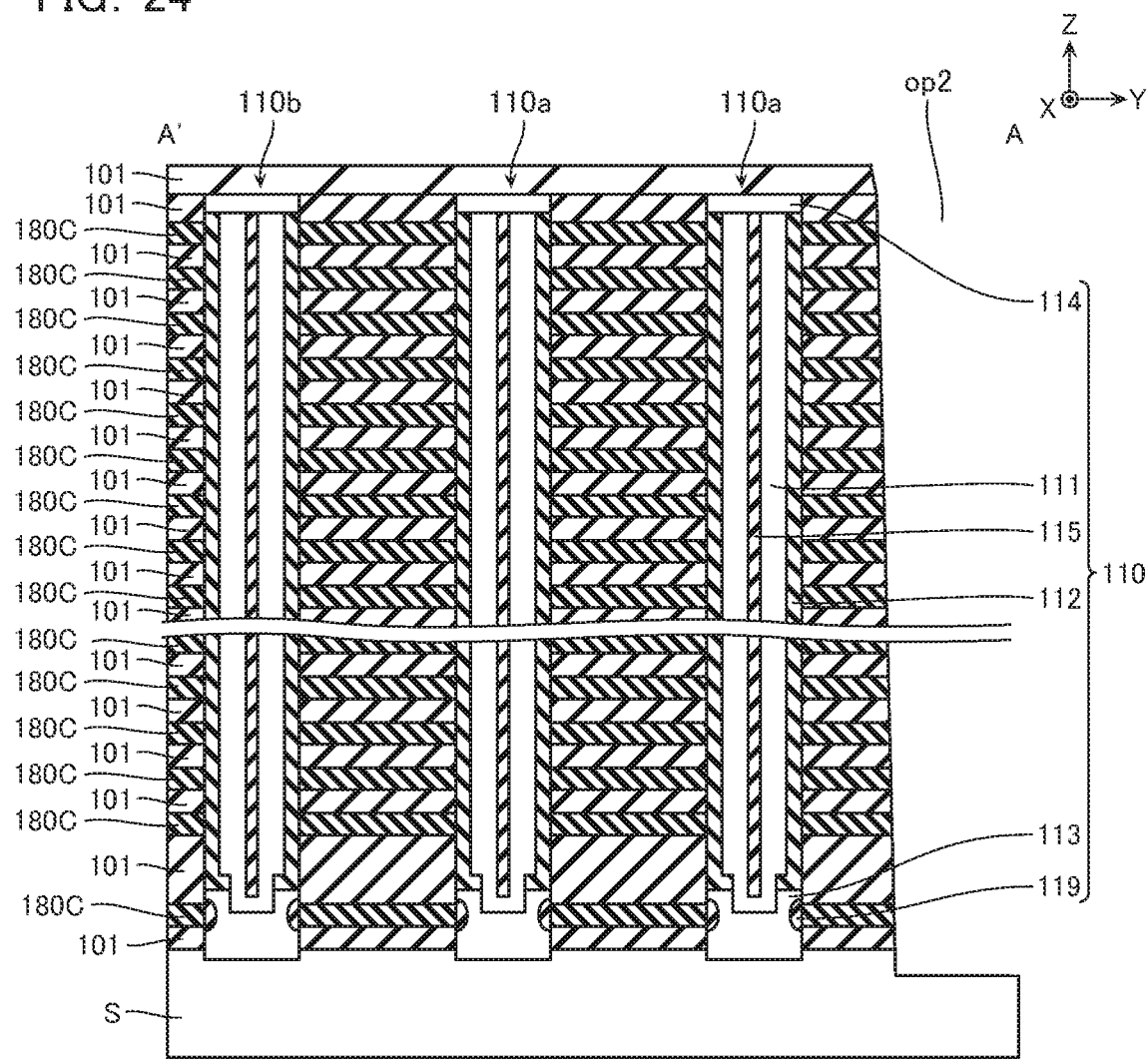
FIG. 24 is a schematic cross-sectional view of a semiconductor memory device according to a comparative example.
Figure 25:
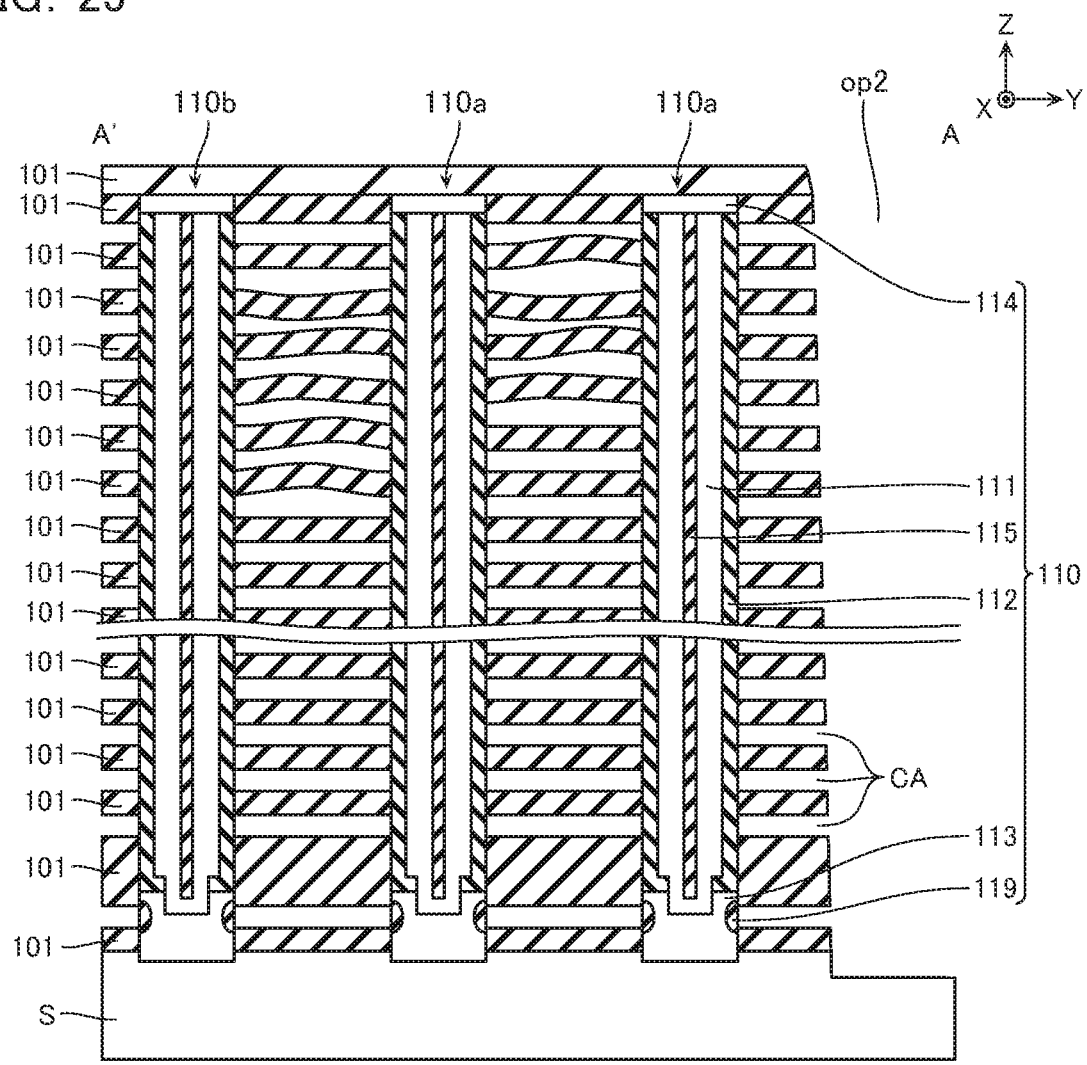
FIG. 25 is a schematic cross-sectional view of the semiconductor memory device.

The effects of the embodiment will be described based on a comparative example illustrated in FIG. 24 and FIG. 25. FIG. 24 and FIG. 25 are schematic cross-sectional views of a semiconductor memory device according to the comparative example.

In the comparative example illustrated in FIG. 24, the sacrifice layers 180A and 180B made of the different materials as in the embodiment are not formed. In the comparative example, only one kind of sacrifice layers 180C made of the same material are disposed.

The sacrifice layers 180C in the comparative example are collectively removed using a chemical solution featuring high etching rate for the sacrifice layers 180C. After the removal, a plurality of cavities CA are formed in the parts where the sacrifice layers 180C were present, and only the insulating layer 101 remains between the cavity CA and the cavity CA. However, the hollow structure in which only the insulating layers 101 remain between the cavities CA is likely to generate, for example, deflection and buckling of the insulating layers 101 as illustrated in FIG. 25 against, for example, stress in the lateral direction.

Additionally, in the structure according to the embodiment as illustrated in FIG. 2, the contact portions 121 on the end portions are formed into the staircase pattern. Therefore, the insulating layers 101 between the cavities CA in the contact portions 121 differ in length in the lateral direction between the upper layer parts and the lower layer parts, and therefore a difference in stress in the lateral direction becomes large. Especially, in the stepped part in the region R2 where the contact 130 and the like are disposed, since a formation interval between the first structures 140 is larger than a formation interval between the memory structures 110, for example, deflection and buckling of the insulating layer 101 are likely to occur.

In the case where, for example, deflection or buckling of the insulating layer 101 occurs, embedding failure or the like occurs in the formation of the conductive layers 120 subsequent to the removal of the sacrifice layers 180C. The embedding failure or the like causes disconnection of the conductive layers 120, resulting in a failure of the memory cell MC.

Therefore, in the embodiment, the sacrifice layers 180A and 180B are made by different materials. Additionally, as the chemical solution to remove the sacrifice layers 180A by wet etching, one that features the high etching rate for the sacrifice layer 180A and sufficiently low etching rate for the sacrifice layer 180B is used.

In the embodiment, in the process illustrated in FIG. 18, when the sacrifice layers 180A are removed, the plurality of cavity portions are formed similarly to the comparative example. However, the hollow structure at this time point is supported by the three-layer structure, which is the sacrifice layer 180B and the insulating layers 101 arranged on both sides of the sacrifice layer 180B, and therefore the hollow structure can have a structural strength higher than that of the comparative example where the hollow structure is supported only with the insulating layers 101.

The same applies to the case where the sacrifice layers 180B are removed in the process illustrated in FIG. 22. The hollow structure at this time is supported by the three-layer structure, which is the conductive layer 120 formed in the part where the sacrifice layer 180A was present and the insulating layers 101 disposed on both sides of the conductive layer 120. Accordingly, similarly to the above, the hollow structure can be in a high structural strength state.

As described above, in the embodiment, the conductive layers 120 can be formed without through the process of providing the many hollow structures as in the comparative example. Accordingly, a structural defect, such as deflection and buckling of the insulating layer 101, is substantially reduced. This allows obtaining an effect of improving a manufacturing yield.

Additionally, in the embodiment, the thicknesses of the insulating layer 101 and the sacrifice layers 180A and 180B are configured to be thin further, and this makes it possible to achieve the memory cell array MA having a multi-layer structure further and having a large storage capacity. However, the thinner the thickness of each layer is, the above-described deflection, buckling, and the like are likely to occur.

Against the problem, the configuration of the embodiment has the effect that deflection, buckling, and the like of the insulating layer 101 are less likely to occur. Accordingly, the memory cell array MA having the large storage capacity further is easily manufactured.

Another Embodiment

In the example of FIG. 6 and FIG. 7, the sacrifice layers 180A and the sacrifice layers 180B are stacked in alternation via the insulating layers 101. However, the sacrifice layers 180A and the sacrifice layers 180B may be arranged in every n layers (n is an integer of two or more).

Figure 26:
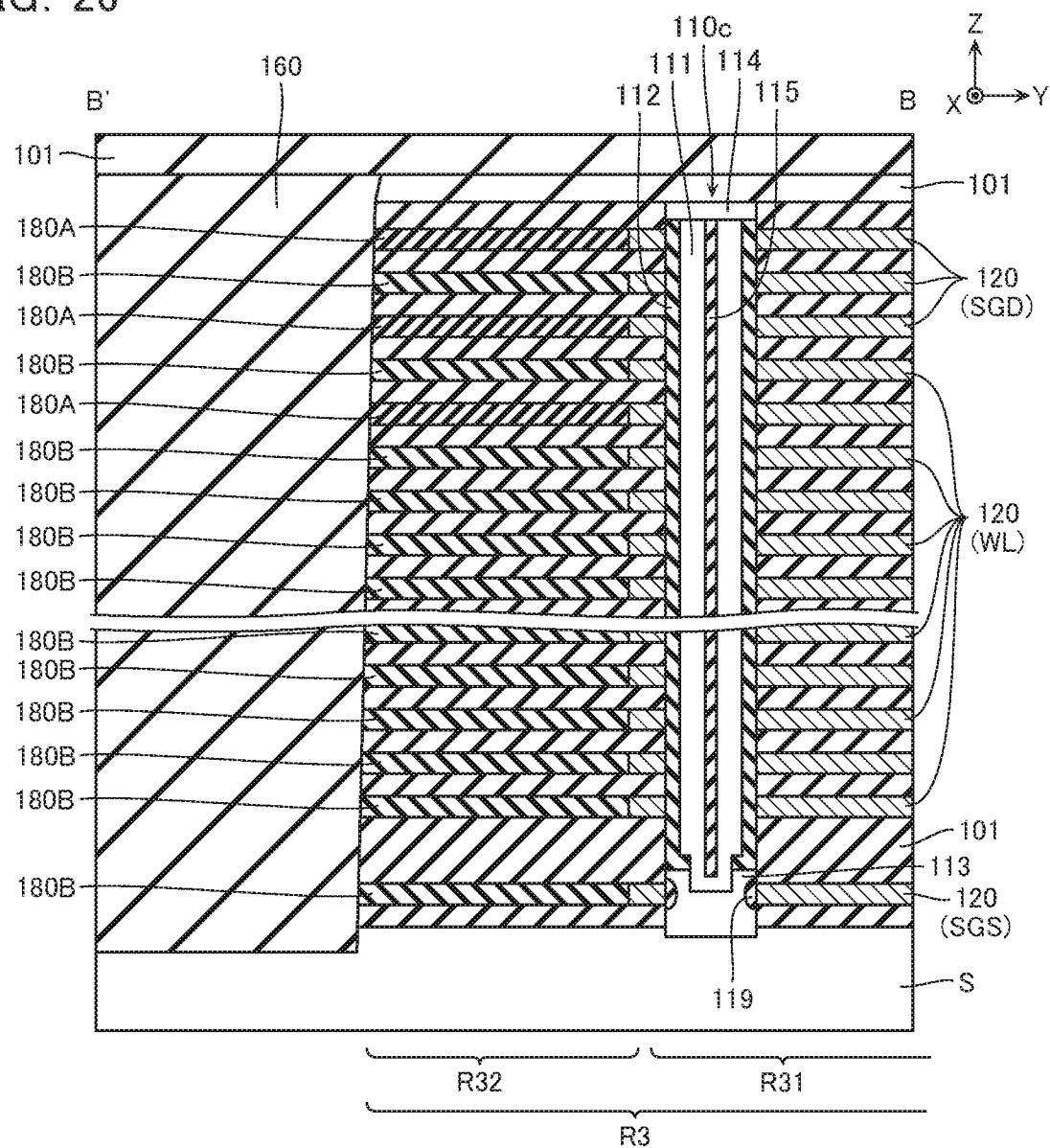
FIG. 26 is a schematic cross-sectional view of a semiconductor memory device according to a modification.

Additionally, the sacrifice layers 180A and the sacrifice layers 180B need not be stacked by the same number of layers. FIG. 26 is a schematic cross-sectional view of a semiconductor memory device according to a modification. As described above, due to an influence of the staircase pattern in the region R2, stress is concentrated further on the upper layer part of the stacked structure of the insulating layer 101, and deflection, buckling, and the like are likely to occur especially in the part in some cases. In such a case, as illustrated in FIG. 26, the sacrifice layers 180A and 180B may be appropriately arranged in the upper layer part of the stacked structure and the sacrifice layers 180B may be arranged many in the other part.

Meanwhile, there may be a case where stress concentrates on the lower layer part of the stacked structure and deflection, buckling, or the like is likely to occur especially in the part. For example, there may be a case where the holes forming the memory structures 110 and the first structures 140 are formed into tapered shapes whose diameters decrease toward the lower side. In view of this, in the insulating layer 101 disposed in the lower layer, a distance between the memory structures 110 and a distance between the first structures 140 become long, thereby strain or buckling is likely to occur. In this case, conversely to the above-described case, the sacrifice layers 180A and 180B may be appropriately arranged in the lower layer part of the stacked structure and the sacrifice layers 180B may be arranged many in the other part.

In addition to the sacrifice layers 180A and the sacrifice layers 180B, third sacrifice layers 180D may be disposed. In this case, a process of removing the sacrifice layers 180A, 180B, and 180D may be divided into three stages and performed similarly. The third sacrifice layer 180D forms a third cavity, and a third conductive layer is formed in the third cavity.

Figure 27:
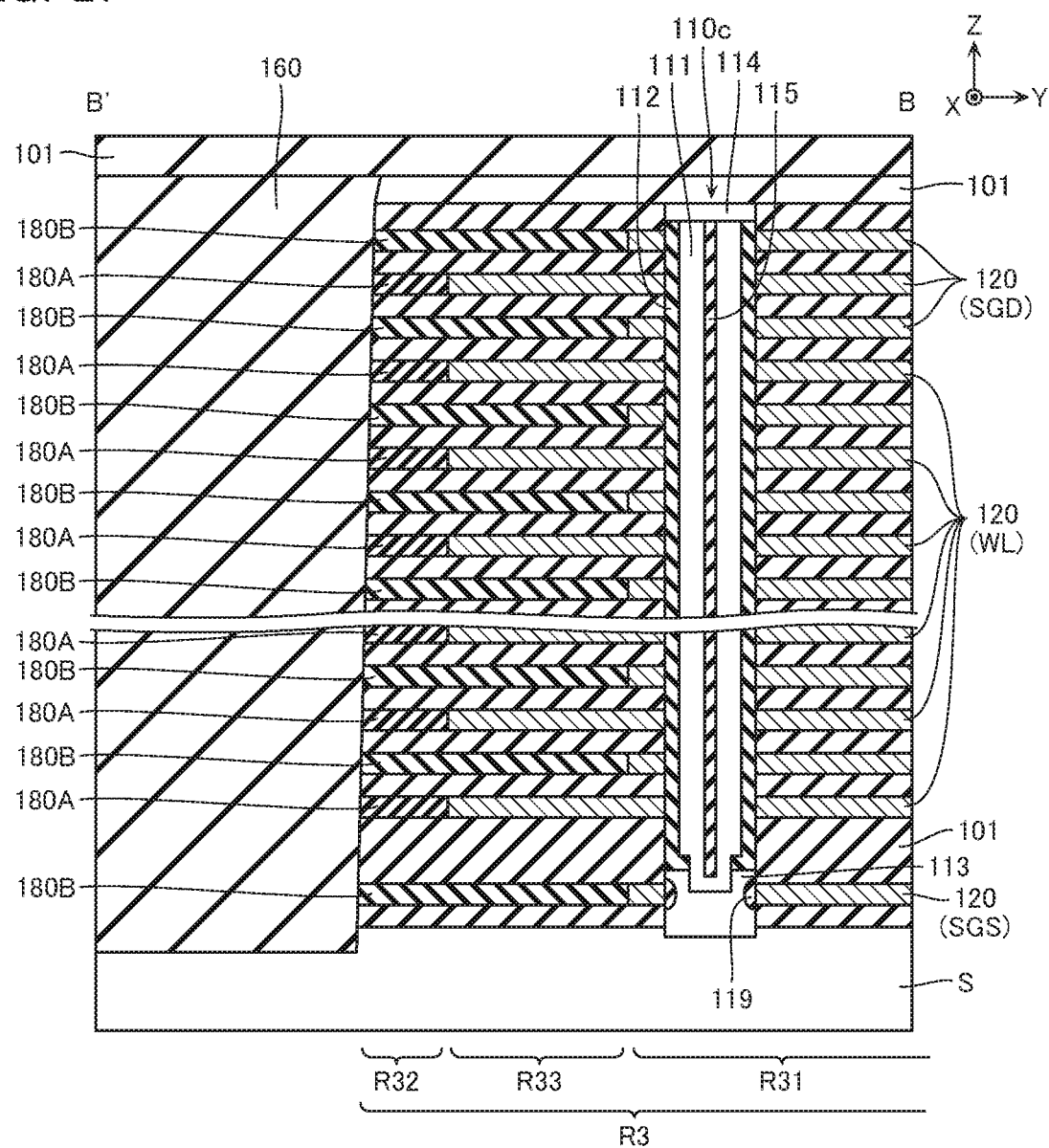
FIG. 27 is a schematic cross-sectional view of a semiconductor memory device according to another modification.

As illustrated in FIG. 27, the region R3 may include a region R33 between the regions R31 and R32. FIG. 27 is a schematic cross-sectional view of a semiconductor memory device according to another modification. In the example illustrated in FIG. 27, in the region R33, the sacrifice layers 180B and the conductive layers 120 are disposed between the insulating layers 101. Top surfaces and lower surfaces of the sacrifice layer 180B and the conductive layer 120 are in contact with the insulating layers 101. The sacrifice layer 180A has a side surface in contact with the conductive layer 120 between the region R32 and the region R33. Meanwhile, the sacrifice layer 180B has a side surface in contact with the conductive layer 120 between the region R33 and the region R31.

Figure 28:
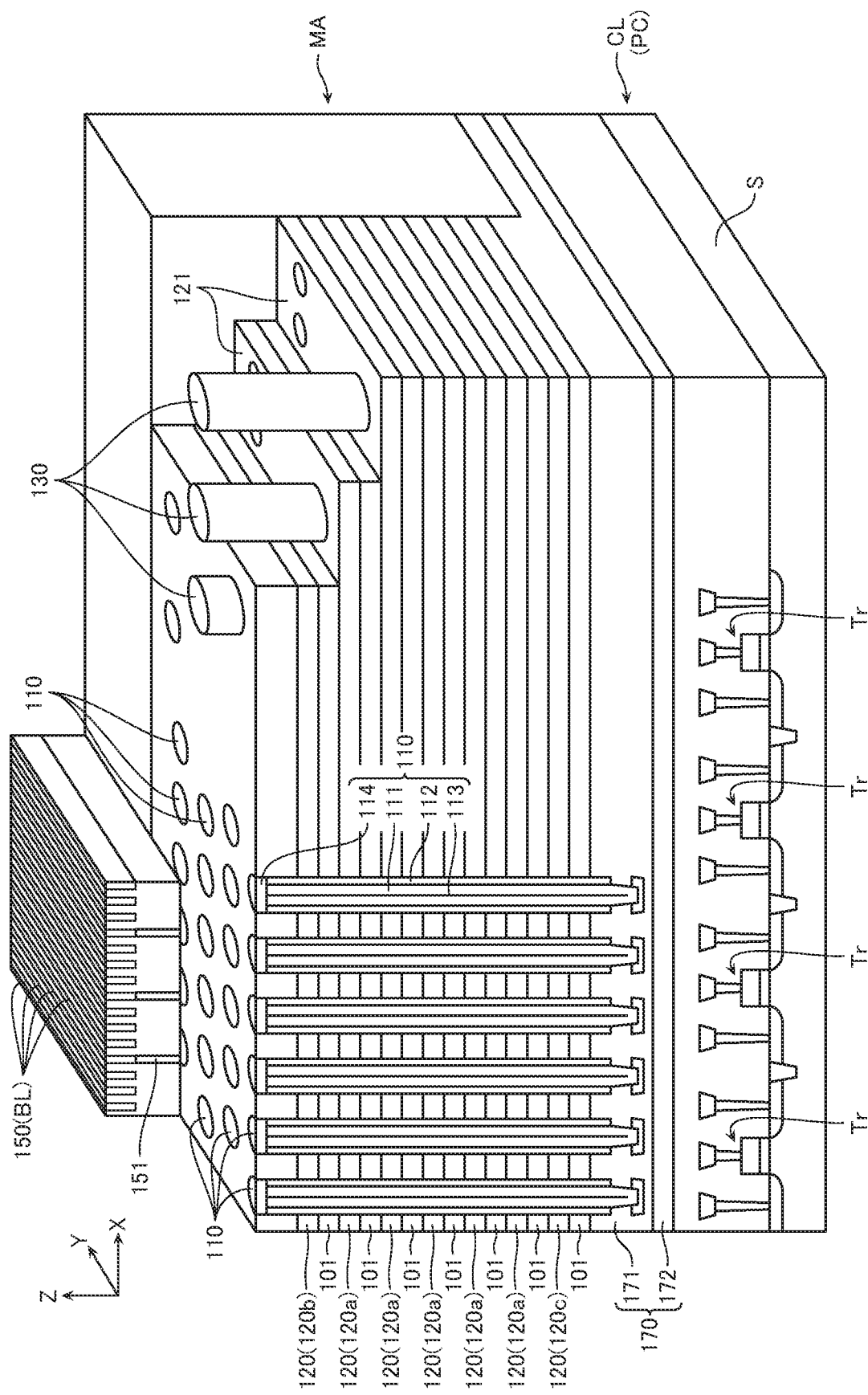
FIG. 28 is a schematic perspective view of a semiconductor memory device according to another embodiment.

Further, FIG. 28 illustrates a schematic perspective view of a semiconductor memory device according to another embodiment. In the first embodiment, as illustrated in FIG. 2 and FIG. 4, the peripheral circuit PC is disposed adjacent to the plurality of memory cell array MA on the substrate S. However, as illustrated in FIG. 28, the peripheral circuit PC may be disposed in a circuit layer CL between the memory cell array MA and the substrate S.

The circuit layer CL includes a plurality of transistors Tr constituting the peripheral circuit PC (FIG. 1) and a plurality of wirings and contacts connected to the plurality of transistors Tr. In the example illustrated in FIG. 28, a wiring layer 170 may include a conductive layer 171 connected to the memory structure 110 and a conductive layer 172 disposed on a lower surface of the conductive layer 171.

OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate including a first region over which a plurality of memory cells for storing data are disposed and a second region arranged on an outer side of the first region in a first direction;
a stacked structure including a plurality of conductive layers separated from each other in the stacked structure in a second direction perpendicular to the first direction above the first region of the substrate and including a plurality of first layers separated from each other in the stacked structure in the second direction above the second region of the substrate; and
a plurality of columnar structures that extend in the second direction and are opposed to the conductive layers above the first region of the substrate, the columnar structures forming the memory cells at intersections with at least some of the plurality of conductive layers, wherein
the conductive layers include a plurality of first conductive layers and a plurality of second conductive layers arranged in the second direction, and the first layers include a plurality of first films disposed in same layers as the first conductive layers and a plurality of second films disposed in same layers as the second conductive layers, the first and second films being arranged in the second direction, the first films being different in material from the first conductive layers, the second films being different in material from the second conductive layers,
the first conductive layers of the conductive layers and the first films of the first layers in the stacked structure are coupled with each other in the first direction, and the second conductive layers of the conductive layers and the second films of the first layers in the stacked structure are coupled with each other in the first direction, and
respective coupling portions of the first films with the first conductive layers are farther from the first region in the first direction than respective coupling portions of the second films with the second conductive layers.

2. The semiconductor memory device according to claim 1, wherein the stacked structure further includes a plurality of insulating layers, the insulating layers being different in material from the first films, the insulating layers being different in material from the second films, the conductive layers and the insulating layers being alternately stacked in the second direction above the first region of the substrate, and the first layers and the insulating layers being alternately stacked in the second direction above the second region of the substrate.

3. The semiconductor memory device according to claim 2, wherein
the substrate further includes a third region between the first region and the second region in the first direction, and
the first conductive layers and the second films are separated from each other in the stacked structure in the second direction above the third region of the substrate.

4. The semiconductor memory device according to claim 3, wherein the second conductive layers and the first films are not disposed above the third region of the substrate.

5. The semiconductor memory device according to claim 3, wherein the insulating layers are provided above the first, second, and third regions of the substrate.

6. The semiconductor memory device according to claim 5, wherein each of upper surfaces and lower surfaces of the second films is in contact with a corresponding one of the insulating layers above the third region of the substrate.

7. The semiconductor memory device according to claim 6, wherein the second films include silicon nitride.

8. The semiconductor memory device according to claim 6, wherein the insulating layers include silicon oxide.

9. The semiconductor memory device according to claim 3, wherein at least one second film is disposed above the first conductive layers and at least another second film is disposed below the first conductive layers above the third region of the substrate.

10. The semiconductor memory device according to claim 1, wherein an etching rate of the first films with respect to phosphoric acid is different from an etching rate of the second films with respect to phosphoric acid.

11. A semiconductor memory device comprising:
a substrate including a first region and a second region arranged in a first direction;
a stacked structure including a plurality of conductive layers separated from each other in the stacked structure in a second direction perpendicular to the first direction above the first region of the substrate and including a plurality of first layers separated from each other in the stacked structure in the second direction above the second region of the substrate;
a semiconductor layer that extends in the second direction and is opposed to the conductive layers; and
a gate insulating layer disposed between the conductive layers and the semiconductor layer, wherein
the conductive layers include a plurality of first conductive layers and a plurality of second conductive layers arranged in the second direction, and the first layers include a plurality of first films disposed in same layers as the first conductive layers and a plurality of second films disposed in same layers as the second conductive layers, the first and second films being arranged in the second direction, the first films being different in material from the first conductive layers, the second films being different in material from the second conductive layers,
the first conductive layers of the conductive layers and the first films of the first layers in the stacked structure are coupled with each other in the first direction, and the second conductive layers of the conductive layers and the second films of the first layers in the stacked structure are coupled with each other in the first direction, and respective coupling portions of the first films with the first conductive layers are approximately aligned in the second direction and substantially away from respective coupling portions of the second films with the second conductive layers in the first direction.

12. The semiconductor memory device according to claim 11, wherein the stacked structure further includes a plurality of first insulating layers, the first insulating layers being different in material from the first films, the first insulating layers being different in material from the second films, the conductive layers and the first insulating layers being alternately stacked in the second direction above the first region of the substrate, and the first layers and the first insulating layers being alternately stacked in the second direction above the second region of the substrate.

13. The semiconductor memory device according to claim 12, wherein
the substrate further includes a third region between the first region and the second region in the first direction, and
the first conductive layers and the second films are separated from each other in the stacked structure in the second direction above the third region of the substrate.

14. The semiconductor memory device according to claim 13, wherein the second conductive layers and the first films are not disposed above the third region of the substrate.

15. The semiconductor memory device according to claim 13, wherein the first insulating layers are provided above the first, second, and third regions of the substrate.

16. The semiconductor memory device according to claim 15, wherein each of upper surfaces and lower surfaces of the second films is in contact with a corresponding one of the first insulating layers above the third region of the substrate.

17. The semiconductor memory device according to claim 16, wherein the second films include silicon nitride.

18. The semiconductor memory device according to claim 16, wherein the first insulating layers include silicon oxide.

19. The semiconductor memory device according to claim 13, wherein at least one second film is disposed above the first conductive layers and at least another second film is disposed below the first conductive layers above the third region of the substrate.

20. The semiconductor memory device according to claim 11, wherein an etching rate of the first films with respect to phosphoric acid is different from an etching rate of the second films with respect to phosphoric acid.

* * * * *